US012685101B2

(12) United States Patent
Huang

(10) Patent No.: US 12,685,101 B2
(45) Date of Patent: Jul. 14, 2026

(54) SEMICONDUCTOR DEVICE WITH A LINER LAYER

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 699 days.

(21) Appl. No.: 18/077,382

(22) Filed: Dec. 8, 2022

(65) Prior Publication Data

US 2024/0194524 A1 Jun. 13, 2024

(51) Int. Cl.
H01L 21/768 (2006.01)
H01L 23/522 (2006.01)

(52) U.S. Cl.
CPC .. H01L 21/76846 (2013.01); H01L 21/76831 (2013.01); H01L 21/76877 (2013.01); H01L 23/5226 (2013.01)

(58) Field of Classification Search
CPC ........... H01L 23/5226; H01L 23/53295; H01L 21/76897; H01L 21/76843; H01L 21/76831; H01L 21/76877
See application file for complete search history.

(56) References Cited

U.S. PATENT DOCUMENTS 7,064,059 B2 * 6/2006 Kim .................. H01L 21/31144
438/738
7,241,682 B2 * 7/2007 Ho .................... H01L 21/76808
438/700

2005/0003656 A1 * 1/2005 Chung .............. H01L 21/76808
438/631
2006/0060971 A1 * 3/2006 Ning ................. H01L 21/76807
257/762
2006/0105567 A1 * 5/2006 Ramachandrarao ........................
H01L 21/31144
257/E21.25
2006/0121721 A1 * 6/2006 Lee ................... H01L 21/76808
438/618
2006/0160362 A1 * 7/2006 Huang ............. H01L 21/76808
438/700

(Continued)

FOREIGN PATENT DOCUMENTS

TW 444340 B 7/2001

OTHER PUBLICATIONS

Office Action and and the search report mailed on Dec. 24, 2024 related to Taiwanese Application No. 113100929.

(Continued)

*Primary Examiner* — John M Parker
(74) *Attorney, Agent, or Firm* — Xuan Zhang

(57) ABSTRACT

The present application discloses a semiconductor device. The semiconductor device includes a substrate; a first dielectric layer positioned on the substrate; a first opening positioned along the first dielectric layer to expose the substrate; a first liner layer conformally positioned in the first opening and on a top surface of the first dielectric layer; an energy-removable layer positioned in the first opening; a second dielectric layer positioned on the first liner layer; and a second opening positioned along the second dielectric layer to expose the energy-removable layer. The second dielectric layer has etching selectivity to the first liner layer.

10 Claims, 19 Drawing Sheets

(56)            References Cited

U.S. PATENT DOCUMENTS

| 2006/0170106 | A1* | 8/2006 | Tseng ................. H01L 23/5329 |
| | | | 257/E23.145 |
| 2011/0084320 | A1* | 4/2011 | Jung ................... H01L 21/2855 |
| | | | 438/643 |
| 2022/0359372 | A1 | 11/2022 | Huang et al. |
| 2022/0384429 | A1 | 12/2022 | Chiang et al. |
| 2022/0384562 | A1 | 12/2022 | Yeh et al. |

OTHER PUBLICATIONS

Office Action and and the search report mailed on Aug. 6, 2024
related to Taiwanese Application No. 113100929.
Office Action and and the search report mailed on Nov. 8, 2023
related to Taiwanese Application No. 1 112116632.

* cited by examiner

10

Z

603

121

211

111

101

111TS

301

121O

W2

W1

111O 605
121
211
111
101

1210

1110

Z

121

213

111

101

121O

111O

213

SEMICONDUCTOR DEVICE WITH A LINER LAYER

TECHNICAL FIELD

The present disclosure relates to a semiconductor device, and more particularly, to a semiconductor device with a liner layer.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a first dielectric layer positioned on the substrate; a first opening positioned along the first dielectric layer to expose the substrate; a first liner layer conformally positioned in the first opening and on a top surface of the first dielectric layer; an energy-removable layer positioned in the first opening; a second dielectric layer positioned on the first liner layer; and a second opening positioned along the second dielectric layer to expose the energy-removable layer. The second dielectric layer has etching selectivity to the first liner layer.

Another aspect of the present disclosure provides a semiconductor device including a substrate; a first dielectric layer positioned on the substrate; a second dielectric layer positioned on the first dielectric layer; a bottom portion positioned along the first dielectric layer and on the substrate; a top portion positioned along the second dielectric layer and on the bottom portion; and a first liner layer positioned between the bottom portion and the first dielectric layer, between the bottom portion and the substrate, and between the second dielectric layer and the first dielectric layer. The bottom portion and the top portion configure a conductive structure. The second dielectric layer has etching selectivity to the first liner layer. The first liner layer includes titanium nitride, tantalum nitride, or a combination thereof.

Another aspect of the present disclosure provides a semiconductor device including a substrate; a first dielectric layer positioned on the substrate; a second dielectric layer positioned on the first dielectric layer; a bottom portion positioned along the first dielectric layer and on the substrate; a top portion positioned along the second dielectric layer and on the bottom portion; and an intervening layer positioned between the first dielectric layer and the second dielectric layer. The bottom portion and the top portion configure a conductive structure. The second dielectric layer has etching selectivity to the first liner layer. The intervening layer includes silicon nitride, silicon oxynitride, silicon nitride oxide, or a combination thereof.

Another aspect of the present disclosure provides a method for fabricating a semiconductor device including providing a substrate; forming a first dielectric layer on the substrate; forming a first opening along the first dielectric layer to expose the substrate; conformally forming a first liner layer in the first opening and on a top surface of the first dielectric layer; forming an energy-removable layer on the first liner layer and in the first opening; forming a second dielectric layer on the first liner layer and on the energy-removable layer; forming a second opening along the second dielectric layer to expose the energy-removable layer; removing the energy-removable layer; and forming a conductive structure to fill the first opening and the second opening. The second dielectric layer has etching selectivity to the first liner layer.

Due to the design of the semiconductor device of the present disclosure, the first liner layer may serve as an etching stop layer due to the selectivity between the second dielectric layer and the first liner layer. Hence, the complexity of fabricating the semiconductor device may be reduced. In addition, the profile of the first opening may be intact during the formation of the second opening due to the presence of the energy-removable layer. As a result, the performance of the resultant conductive structure may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
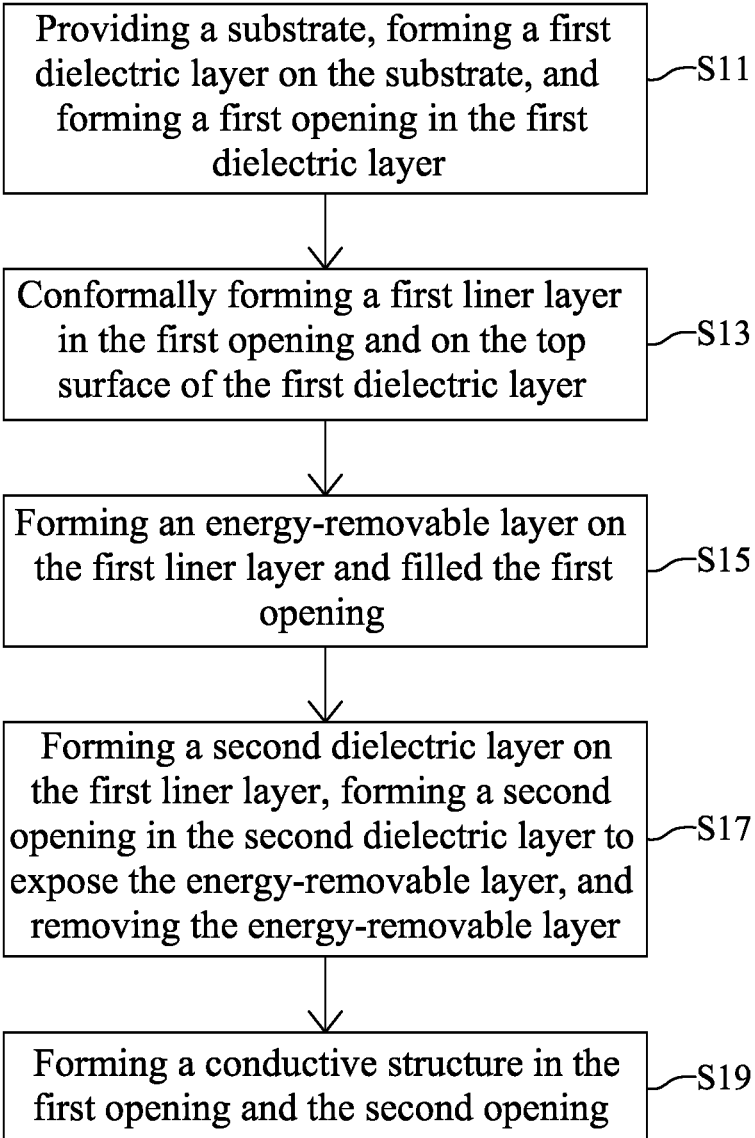
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, the terms "forming," "formed" and "form" may mean and include any method of creating, building, patterning, implanting, or depositing an element, a dopant, or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

Figure 2:
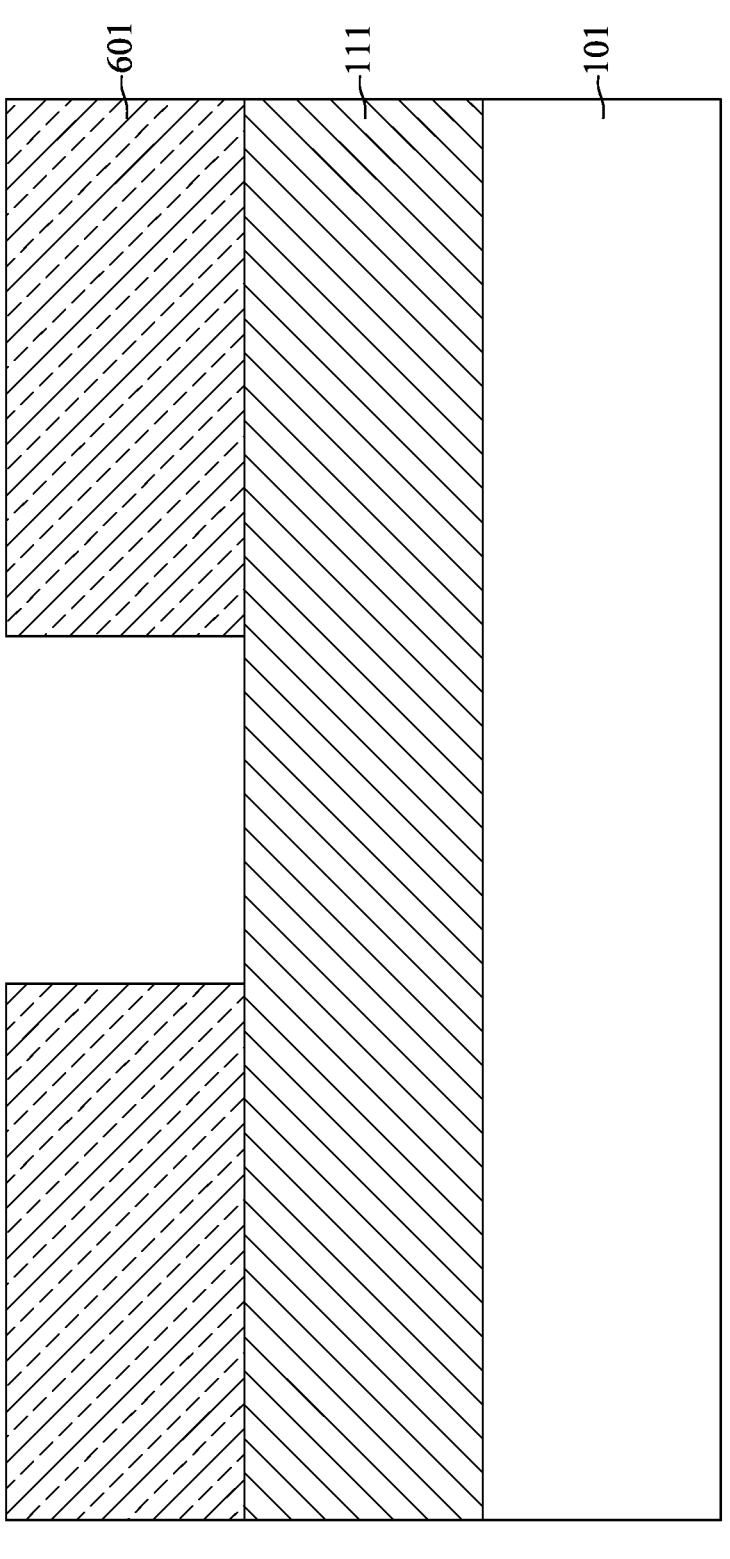
FIGS. 2 to 4 illustrate, in schematic cross-sectional view diagrams, part of a flow for fabricating the semiconductor device in accordance with one embodiment of the present disclosure.
Figure 3:
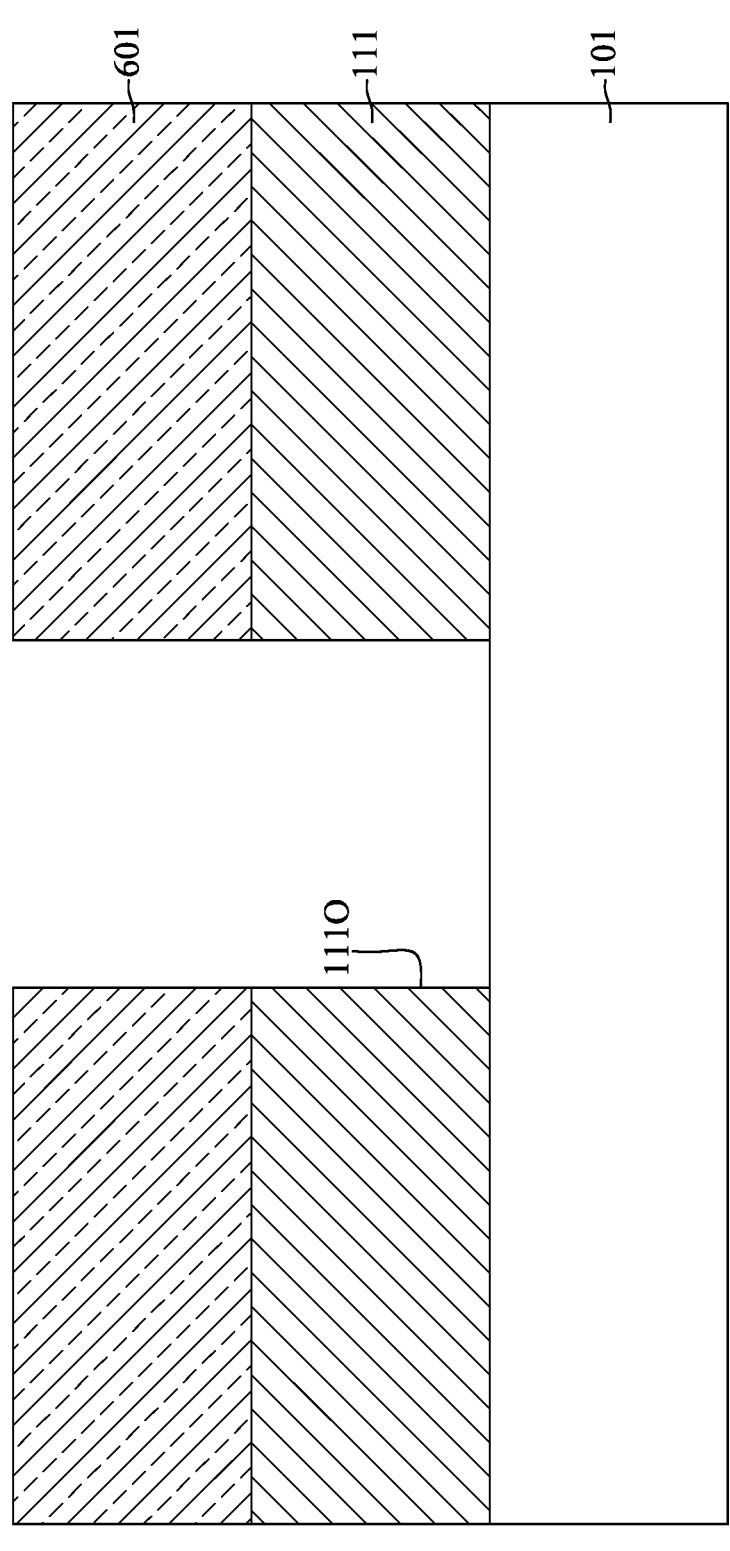
Figure 4:
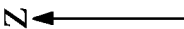
Figure 4:
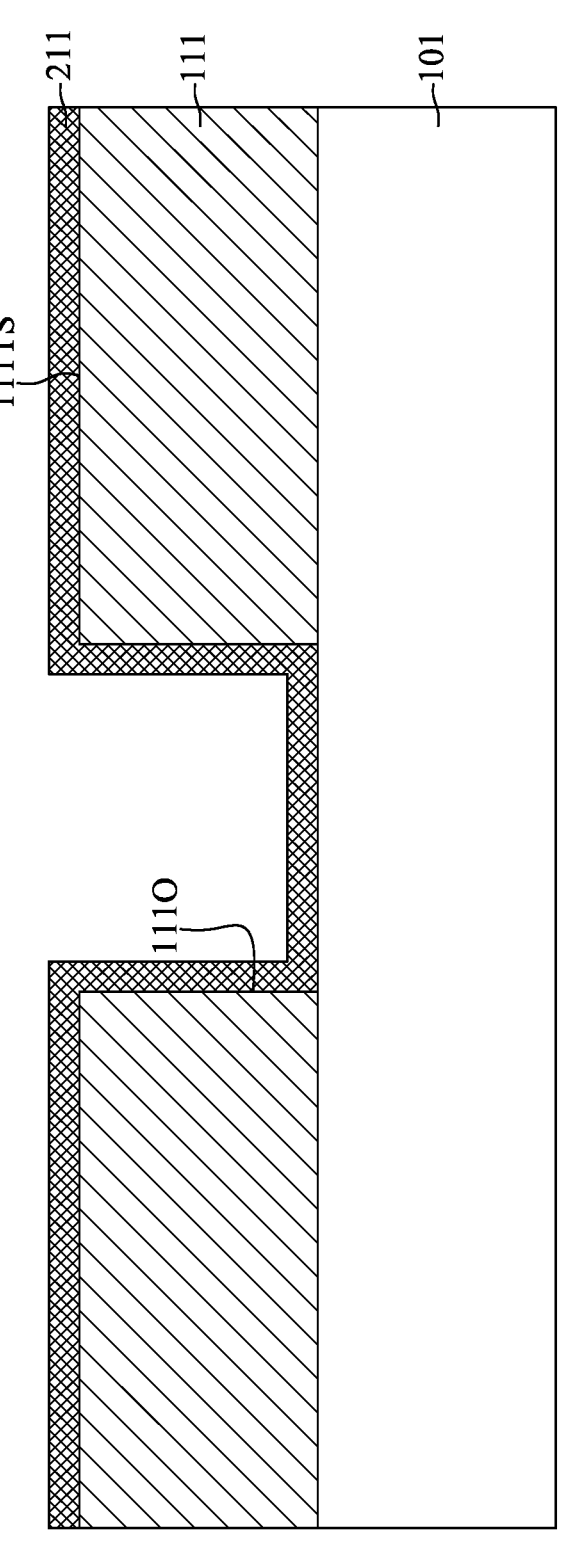
Figure 5:
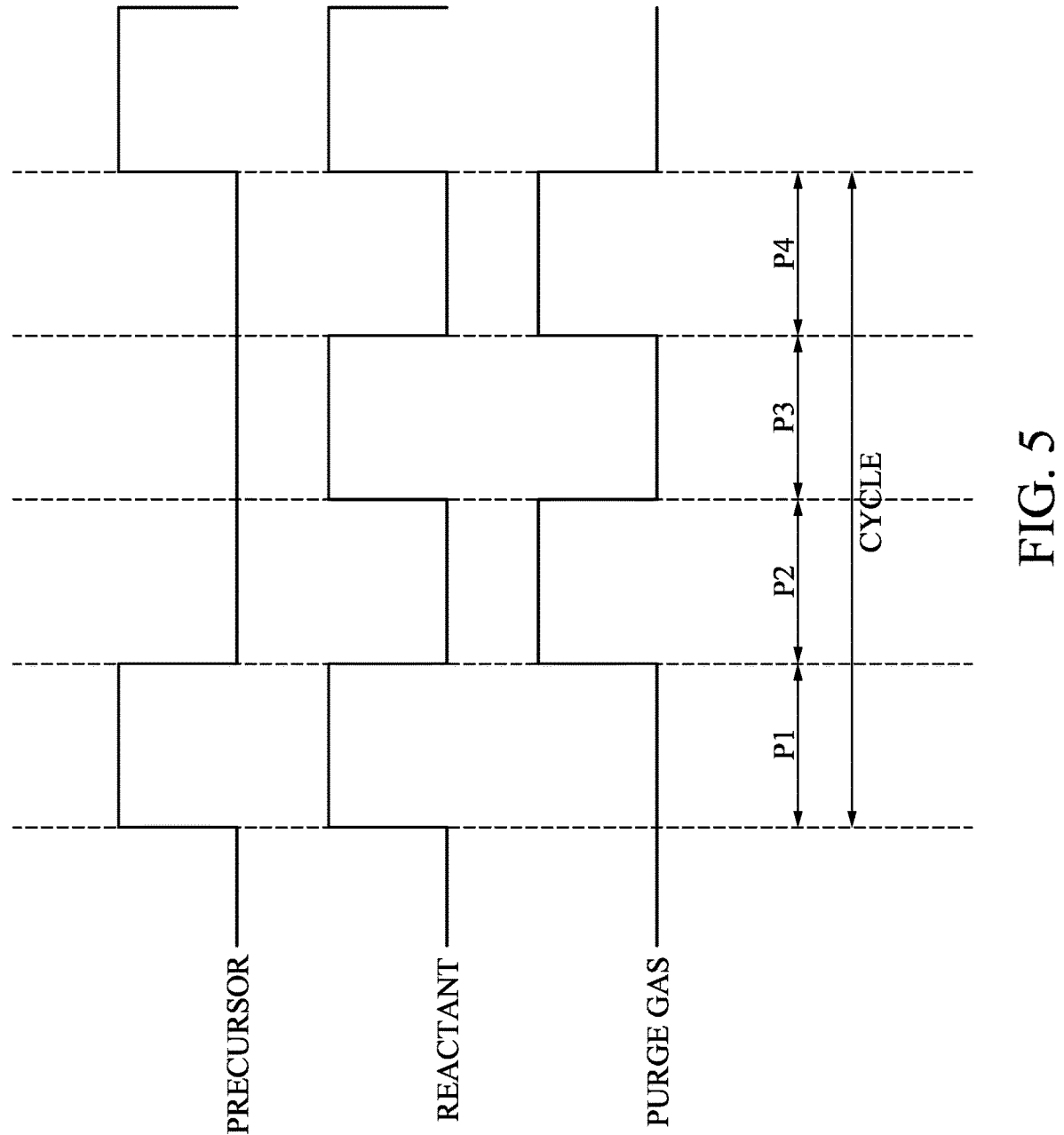
FIGS. 5 and 6 are charts showing examples of process conditions for forming a first liner layer in accordance with some embodiments of the present disclosure.
Figure 6:
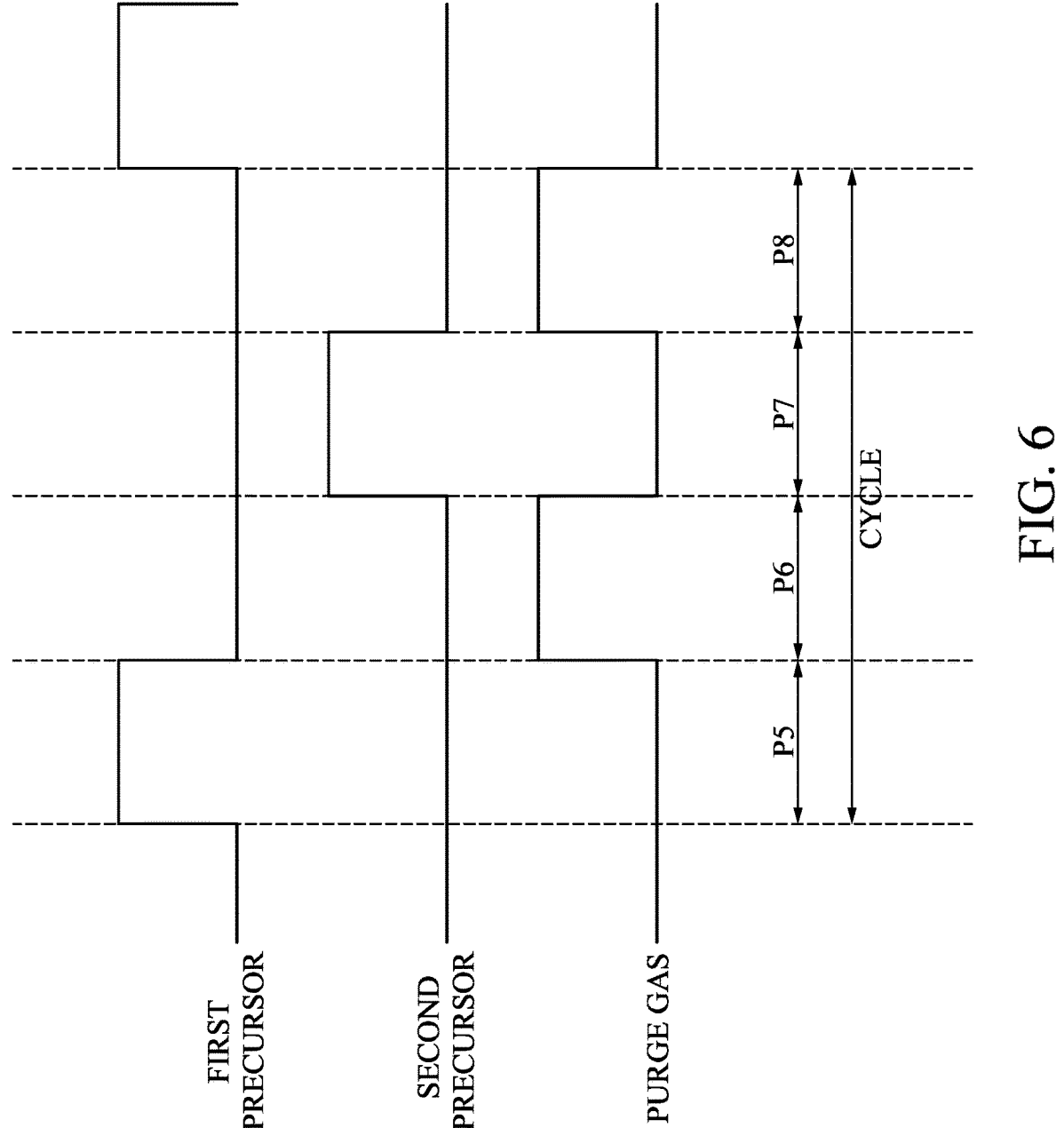

FIG. 1 illustrates, in a flowchart diagram form, a method 10 for fabricating a semiconductor device 1A in accordance with one embodiment of the present disclosure. FIGS. 2 to 4 illustrate, in schematic cross-sectional view diagrams, part of a flow for fabricating the semiconductor device 1A in accordance with one embodiment of the present disclosure. FIGS. 5 and 6 are charts showing examples of process conditions for forming a first liner layer 211 in accordance with some embodiments of the present disclosure.

With reference to FIGS. 1 to 3, at step S11, a substrate 101 may be provided, a first dielectric layer 111 may be formed on the substrate 101, and a first opening 111O may be formed in the first dielectric layer 111.

With reference to FIG. 2, in some embodiments, the substrate 101 may include a bulk semiconductor substrate that is composed entirely of at least one semiconductor material, a plurality of device elements (not shown for clarity), a plurality of dielectric layers (not shown for clarity), and a plurality of conductive features (not shown for clarity). The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 101 may further include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

It should be noted that, in the description of present disclosure, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The plurality of device elements may be formed on the substrate 101. Some portions of the plurality of device elements may be formed in the substrate 101. The plurality of device elements may be transistors such as complementary metal-oxide-semiconductor transistors, metal-oxide-semiconductor field-effect transistors, fin field-effect-transistors, the like, or a combination thereof.

The plurality of dielectric layers may be formed on the substrate 101 and cover the plurality of device elements. In some embodiments, the plurality of dielectric layers may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The plurality of dielectric layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

The plurality of conductive features may include interconnect layers, conductive vias, and conductive pads. The interconnect layers may be separated from each other and may be horizontally disposed in the plurality of dielectric layers along the direction Z. In the present embodiment, the topmost interconnect layers may be designated as the conductive pads. The conductive vias may connect adjacent interconnect layers along the direction Z, adjacent device element and interconnect layer, and adjacent conductive pad and interconnect layer. In some embodiments, the conductive vias may improve heat dissipation and may provide structure support. In some embodiments, the plurality of conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of conductive features may be formed during the formation of the plurality of dielectric layers.

With reference to FIG. 2, in some embodiments, the first dielectric layer 111 may be formed on the substrate 101. The first dielectric layer 111 may include, for example, silicon oxide, undoped silicate glass, fluorosilicate glass, borophosphosilicate glass, a spin-on low-k dielectric layer, a chemical vapor deposition low-k dielectric layer, or a combination thereof. In some embodiments, the first dielectric layer 111 may include a self-planarizing material such as a spin-on glass or a spin-on low-k dielectric material such as SiLK™. In some embodiments, the first dielectric layer 111 may be formed by a deposition process including, for example, chemical vapor deposition, plasma enhanced chemical vapor deposition, evaporation, or spin-on coating.

With reference to FIG. 2, a first mask layer 601 may be formed on the first dielectric layer 111. The first mask layer 601 may include the pattern of the first opening 111O. In some embodiments, the first mask layer 601 may be a photoresist layer.

With reference to FIG. 3, an etching process may be performed to remove a portion of the first dielectric layer 111 to form the first opening 111O. A portion of the substrate 101 may be exposed through the first opening 111O. In some embodiments, the etch rate ratio of the first dielectric layer 111 to the first mask layer 601 may be between about 100:1 and about 1.05:1, between about 15:1 and about 2:1, or between about 10:1 and about 2:1 during the etching process. In some embodiments, the etch rate ratio of the first dielectric layer 111 to the substrate 101 may be between about 100:1 and about 1.05:1, between about 15:1 and about 2:1, or between about 10:1 and about 2:1 during the etching process. After the formation of the first opening 111O, the first mask layer 601 may be removed.

With reference to FIG. 1 and FIGS. 4 to 6, at step S13, a first liner layer 211 may be conformally formed in the first opening 111O and on the top surface 111TS of the first dielectric layer 111.

With reference to FIGS. 4 and 5, in some embodiments, the first liner layer 211 may be formed of, for example, titanium nitride, tantalum nitride, or other applicable conductive metal nitrides. In the present embodiment, the first liner layer 211 is titanium nitride. The first liner layer 211 may be formed by chemical vapor deposition. In some embodiments, the formation of the first liner layer 211 may include a source gas introducing step, a first purging step, a reactant flowing step, and a second purging step. The source gas introducing step, the first purging step, the reactant flowing step, and the second purging step may be referred to as one cycle. Multiple cycles may be performed to obtain the desired thickness of the first liner layer 211.

Detailedly, the intermediate semiconductor device illustrated in FIG. 3 may be loaded in a reaction chamber. In the source gas introducing step, during a period P1, source gases containing a precursor and a reactant may be introduced to the reaction chamber containing the intermediate semiconductor device. The precursor and the reactant may diffuse across the boundary layer and reach the surface of the intermediate semiconductor device (i.e., the inner surface of the first opening 111O and the top surface 111TS of the first dielectric layer 111). The precursor and the reactant may adsorb on and subsequently migrate on the surface aforementioned. The adsorbed precursor and the adsorbed reactant may react on the surface aforementioned and form solid byproducts. The solid byproducts may form nuclei on the surface aforementioned. The nuclei may grow into islands and the islands may merge into a continuous thin film on the surface aforementioned. In the first purging step, during a period P2, a purge gas such as argon may be injected into the reaction chamber to purge out the gaseous byproducts, unreacted precursor, and unreacted reactant.

In the reactant flowing step, during a period P3, the reactant may be solely introduced to the reaction chamber to turn the continuous thin film into the first liner layer 211. In the second purging step, during a period P4, a purge gas such as argon may be injected into the reaction chamber to purge out the gaseous byproducts and unreacted reactant.

In some embodiments, the formation of the first liner layer 211 using chemical vapor deposition may be performed with the assistance of plasma. The source of the plasma may be, for example, argon, hydrogen, or a combination thereof.

For example, the precursor may be titanium tetrachloride. The reactant may be ammonia. Titanium tetrachloride and ammonia may react on the surface and form a titanium nitride film including high chloride contamination due to incomplete reaction between titanium tetrachloride and ammonia. The ammonia in the reactant flowing step may reduce the chloride content of the titanium nitride film. After the ammonia treatment, the titanium nitride film may be referred to as the first liner layer 211.

With reference to FIG. 6, in some other embodiments, the first liner layer 211 may be formed by atomic layer deposition such as photo-assisted atomic layer deposition or liquid injection atomic layer deposition. In some embodiments, the formation of the first liner layer 211 may include a first precursor introducing step, a first purging step, a second precursor introducing step, and a second purging step. The first precursor introducing step, the first purging step, the second precursor introducing step, and the second purging step may be referred to as one cycle. Multiple cycles may be performed to obtain the desired thickness of the first liner layer 211.

Detailedly, the intermediate semiconductor device illustrated in FIG. 3 may be loaded in the reaction chamber. In the first precursor introducing step, during a period P5, a first precursor may be introduced to the reaction chamber. The first precursor may diffuse across the boundary layer and reach the surface of the intermediate semiconductor device (i.e., the inner surface of the first opening 111O and the top surface 111TS of the first dielectric layer 111). The first precursor may adsorb on the surface aforementioned to form a monolayer at a single atomic layer level. In the first purging step, during a period P6, a purge gas such as argon may be injected into the reaction chamber to purge out unreacted first precursor.

In the second precursor introducing step, during a period P7, a second precursor may be introduced to the reaction chamber. The second precursor may react with the monolayer and turn the monolayer into the first liner layer 211. In the second purging step, during a period P8, a purge gas such as argon may be injected into the reaction chamber to purge out unreacted second precursor and gaseous byproduct. Compared to the chemical vapor deposition, a particle generation caused by a gas phase reaction may be suppressed because the first precursor and the second precursor are separately introduced.

For example, the first precursor may be titanium tetrachloride. The second precursor may be ammonia. Adsorbed titanium tetrachloride may form a titanium nitride monolayer. The ammonia in the second precursor introducing step may react with the titanium nitride monolayer and turn the titanium nitride monolayer into the first liner layer 211.

In some embodiments, the formation of the first liner layer 211 using atomic layer deposition may be performed with the assistance of plasma. The source of the plasma may be, for example, argon, hydrogen, oxygen, or a combination thereof. In some embodiments, the oxygen source may be, for example, water, oxygen gas, or ozone. In some embodiments, co-reactants may be introduced to the reaction chamber. The co-reactants may be selected from the group consisting of hydrogen, hydrogen plasma, oxygen, air, water, ammonia, hydrazines, alkylhydrazines, boranes, silanes, ozone and a combination thereof.

In some embodiments, the formation of the first liner layer 211 may be performed using the following process conditions. The substrate temperature may be between about 160° C. and about 300° C. The evaporator temperature may be about 175° C. The pressure of the reaction chamber may be about 5 mbar. The solvent for the first precursor and the second precursor may be toluene.

FIGS. 7 to 13 illustrate, in schematic cross-sectional view diagrams, part of the flow for fabricating the semiconductor device 1A in accordance with one embodiment of the present disclosure.

Figure 7:
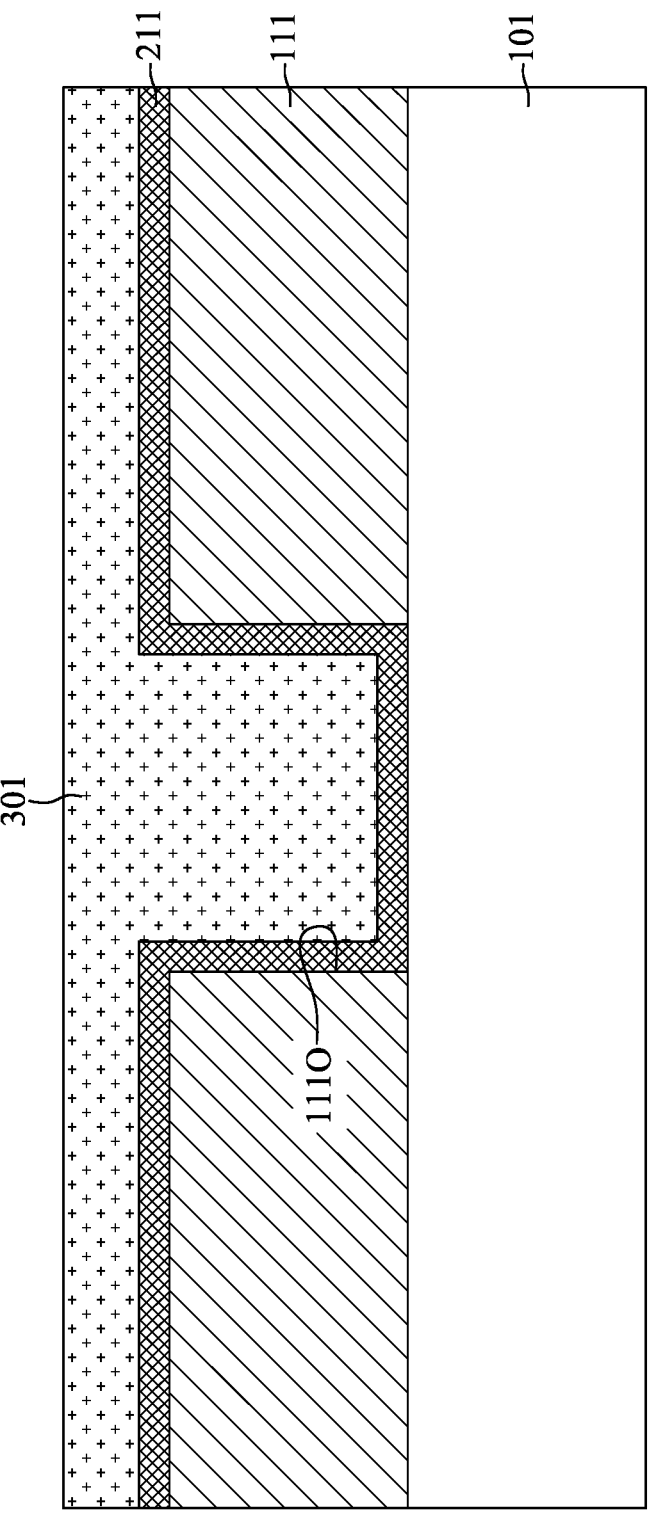
FIGS. 7 to 13 illustrate, in schematic cross-sectional view diagrams, part of the flow for fabricating the semiconductor device in accordance with one embodiment of the present disclosure.
Figure 8:
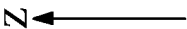
Figure 8:
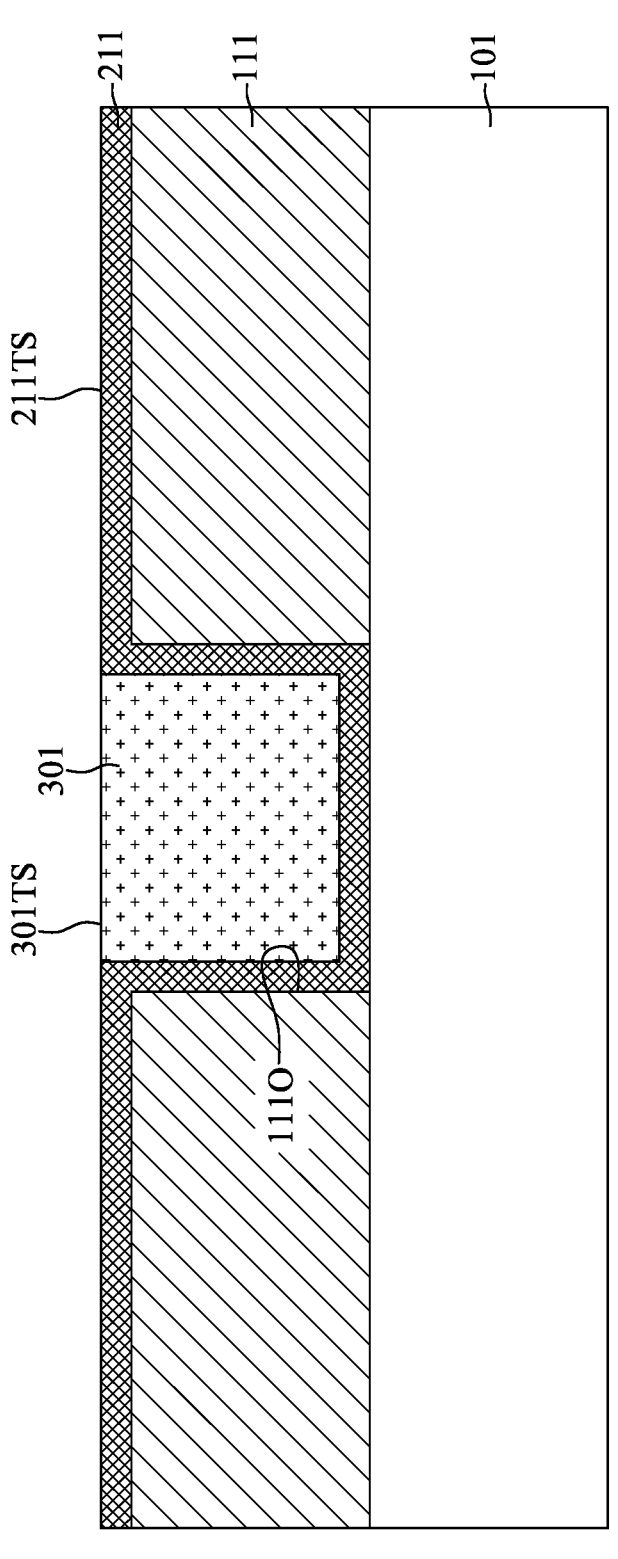

With reference to FIG. 1 and FIGS. 7 and 8, at step S15, an energy-removable layer 301 may be formed on the first liner layer 211 and fill the first opening 111O.

With reference to FIG. 7, the energy-removable layer 301 may be formed on the first liner layer 211 and completely fill the first opening 111O. In some embodiments, the energy-removable layer 301 may include, for example, a thermal decomposable material, a photonic decomposable material, an e-beam decomposable material, or a combination thereof. In some embodiments, the energy-removable layer 301 may include a base material and a decomposable porogen material that is sacrificially removed upon being exposed to an energy source. The base material may include a methylsilsesquioxane based material. The decomposable porogen material may include a porogen organic compound that provides porosity to the base material of the energy-removable material.

In some embodiments, the energy-removable layer 301 may include a relatively high concentration of the decomposable porogen material and a relatively low concentration of the base material but is not limited thereto. For example, the energy-removable layer 301 may include about 75% or greater of the decomposable porogen material, and about 25% or less of the base material. In another example, the energy-removable layer 301 may include about 95% or greater of the decomposable porogen material, and about 5% or less of the base material. In another example, the energy-removable layer 301 may include about 100% of the decomposable porogen material, and no base material is used.

With reference to FIG. 8, a planarization process, such as chemical mechanical polishing, may be performed until the top surface 211TS of the first liner layer 211 is exposed to remove excess material and provide a substantially flat surface for subsequent processing steps. That is, the top surface 301TS of the energy-removable layer 301 and the top surface 211TS of the first liner layer 211 are substantially coplanar.

It should be noted that, in the description of the present disclosure, a surface of an element (or a feature) located at the highest vertical level along the dimension Z is referred to as a top surface of the element (or the feature). A surface of an element (or a feature) located at the lowest vertical level along the dimension Z is referred to as a bottom surface of the element (or the feature).

With reference to FIG. 1 and FIGS. 9 to 11, at step S17, a second dielectric layer 121 may be formed on the first liner layer 211, a second opening 121O may be formed in the second dielectric layer 121 to expose the energy-removable layer 301, and the energy-removable layer 301 may be removed.

Figure 9:

With reference to FIG. 9, in some embodiments, the second dielectric layer 121 may be formed on the first liner layer 211 and on the energy-removable layer 301. In some embodiments, the second dielectric layer 121 may be formed of a material having etching selectivity to the first liner layer 211. In some embodiments, the second dielectric layer 121 and the first dielectric layer 111 may be formed of the same material. In some embodiments, the second dielectric layer 121 and the first dielectric layer 111 may be formed of different materials. In some embodiments, the second dielectric layer 121 may include, for example, silicon oxide, undoped silicate glass, fluorosilicate glass, borophosphosilicate glass, a spin-on low-k dielectric layer, a chemical vapor deposition low-k dielectric layer, or a combination thereof. In some embodiments, the second dielectric layer 121 may include a self-planarizing material such as a spin-on glass or a spin-on low-k dielectric material such as SiLK™. In some embodiments, the second dielectric layer 121 may be formed by a deposition process including, for example, chemical vapor deposition, plasma enhanced chemical vapor deposition, evaporation, or spin-on coating.

With reference to FIG. 9, a second mask layer 603 may be formed on the second dielectric layer 121. The second mask layer 603 may include the pattern of the second opening 121O. In some embodiments, the second mask layer 603 may be a photoresist layer.

Figure 10:
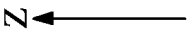

With reference to FIG. 10, an etching process may be performed to remove a portion of the second dielectric layer 121 to form the second opening 121O. The energy-removable layer 301 and a portion of the first liner layer 211 may be exposed through the second opening 121O. In some embodiments, the etch rate ratio of the second dielectric layer 121 to the first liner layer 211 may be between about 100:1 and about 1.05:1, between about 15:1 and about 2:1, or between about 10:1 and about 2:1 during the etching process. In some embodiments, the etch rate ratio of the second dielectric layer 121 to the energy-removable layer 301 may be between about 100:1 and about 1.05:1, between about 15:1 and about 2:1, or between about 10:1 and about 2:1 during the etching process. After the formation of the second opening 121O, the second mask layer 603 may be removed. In some embodiments, the width W1 of the first opening 111O may be less than the width W2 of the second opening 121O.

Figure 11:
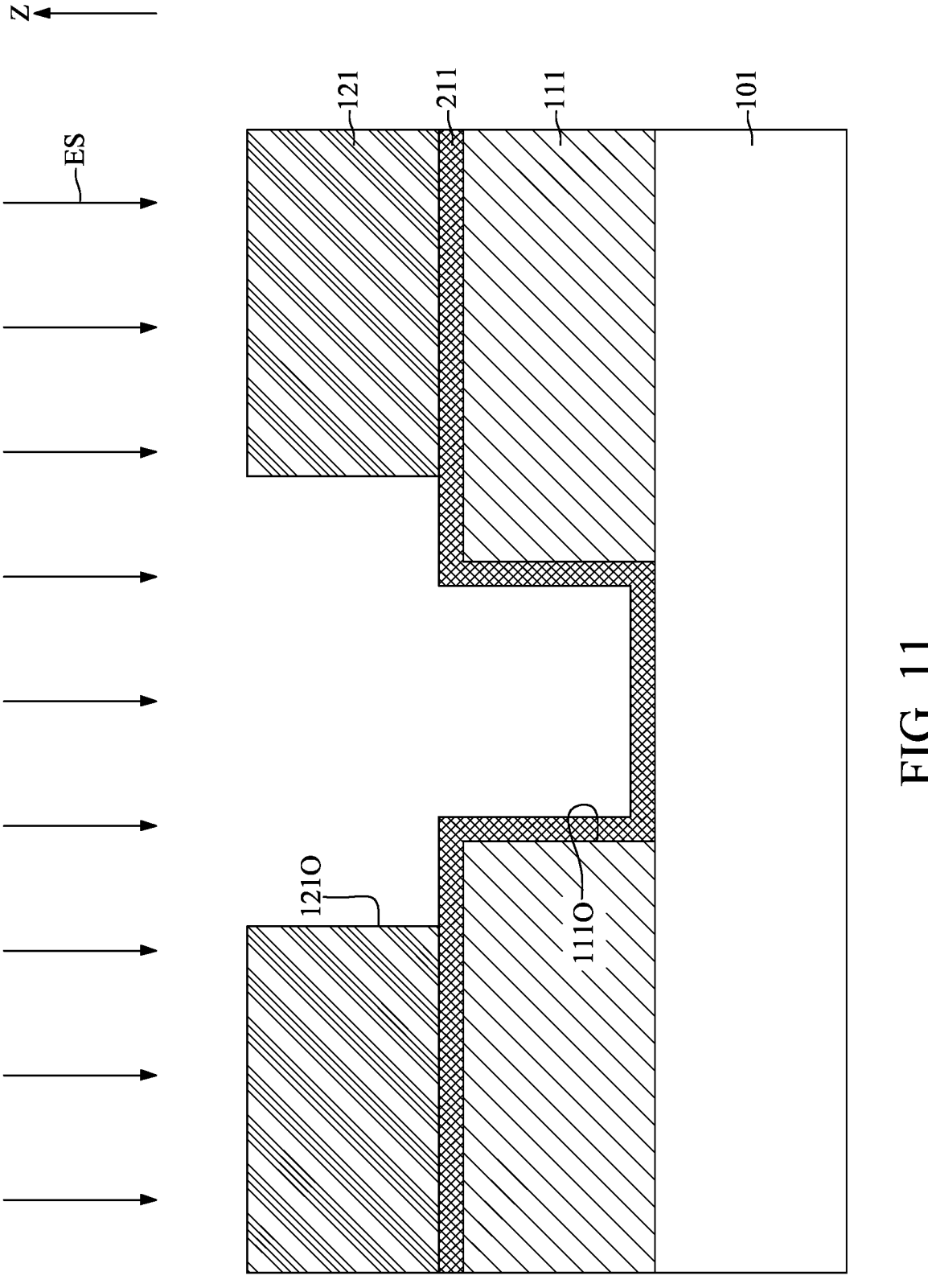

With reference to FIG. 11, a first removal process may be performed to remove the energy-removable layer 301. In some embodiments, the first removal process may be an etching process such as a wet etching process. In some embodiments, the first removal process may be an energy treatment using an energy source ES. The energy source ES may include heat, light, or a combination thereof. When heat is used as the energy source ES, a temperature of the energy treatment may be between about 800° C. and about 900° ° C. When light is used as the energy source ES, an ultraviolet light may be applied.

In some embodiments, the removal rate ratio of the energy-removable layer 301 to the second dielectric layer 121 may be between about 100:1 and about 1.05:1, between about 15:1 and about 2:1, or between about 10:1 and about 2:1 during the first removal process. In some embodiments, the removal rate ratio of the energy-removable layer 301 to the first liner layer 211 may be between about 100:1 and about 1.05:1, between about 15:1 and about 2:1, or between about 10:1 and about 2:1 during the first removal process.

Figure 12:
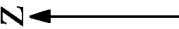
Figure 13:
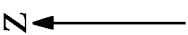

With reference to FIGS. 1, 12, and 13, at step S19, a conductive structure 401 may be formed in the first opening 111O and the second opening 121O.

With reference to FIG. 12, a layer of first conductive material 605 may be formed to completely fill the first opening 111O and the second opening 121O. In some embodiments, the first conductive material 605 may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the layer of first conductive material 605 may be formed by, for example, physical vapor deposition, chemical vapor deposition, sputtering, electroplating, or other applicable deposition processes.

With reference to FIG. 13, a planarization process, such as chemical mechanical polishing, may be performed until the top surface 121TS of the second dielectric layer 121 is exposed to remove excess material, provide a substantially flat surface for subsequent processing steps, and concurrently form the conductive structure 401.

With reference to FIG. 13, the conductive structure 401 may include a bottom portion 403 and a top portion 405. The bottom portion 403 may be formed on the first liner layer 211 and in the first opening 111O. The top portion 405 may be formed on the bottom portion 403 and in the second opening 121O. In some embodiments, the width W3 of the bottom portion 403 may be less than the width W4 of the top portion 405.

Figure 14:
FIG. 14 illustrates, in a schematic cross-sectional view diagram, part of a flow for fabricating a semiconductor device in accordance with another embodiment of the present disclosure.
Figure 14:
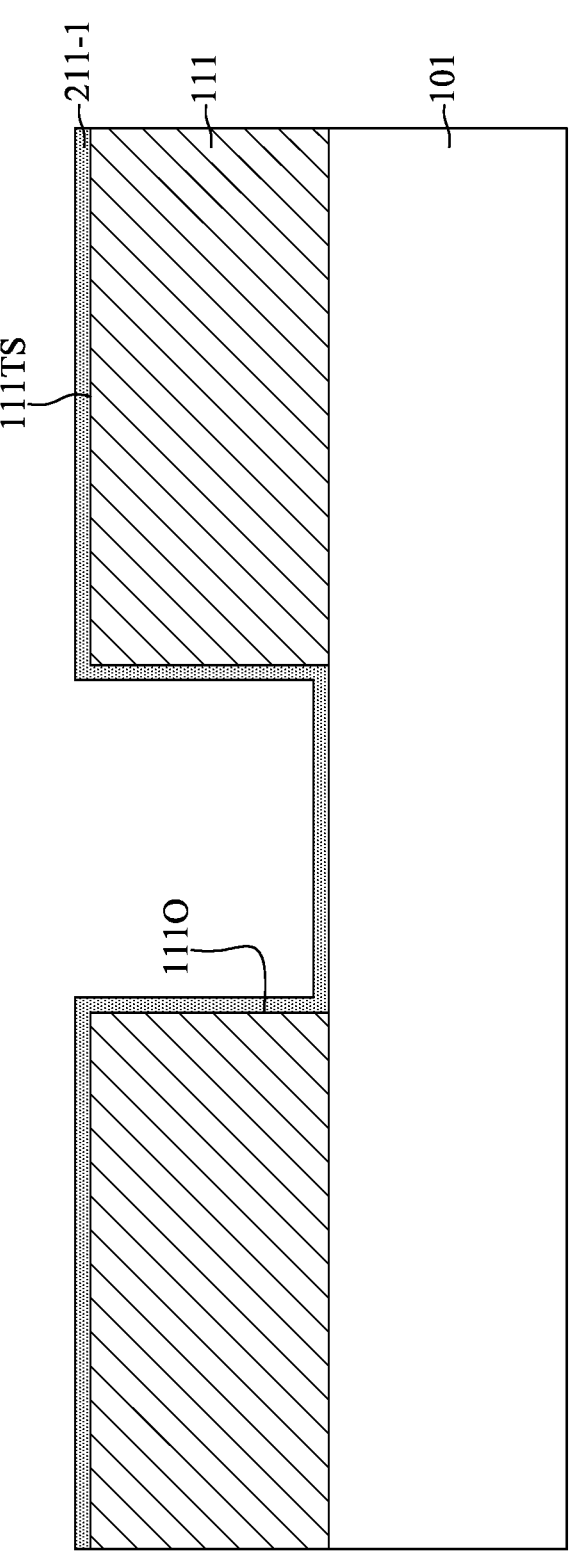
Figure 15:
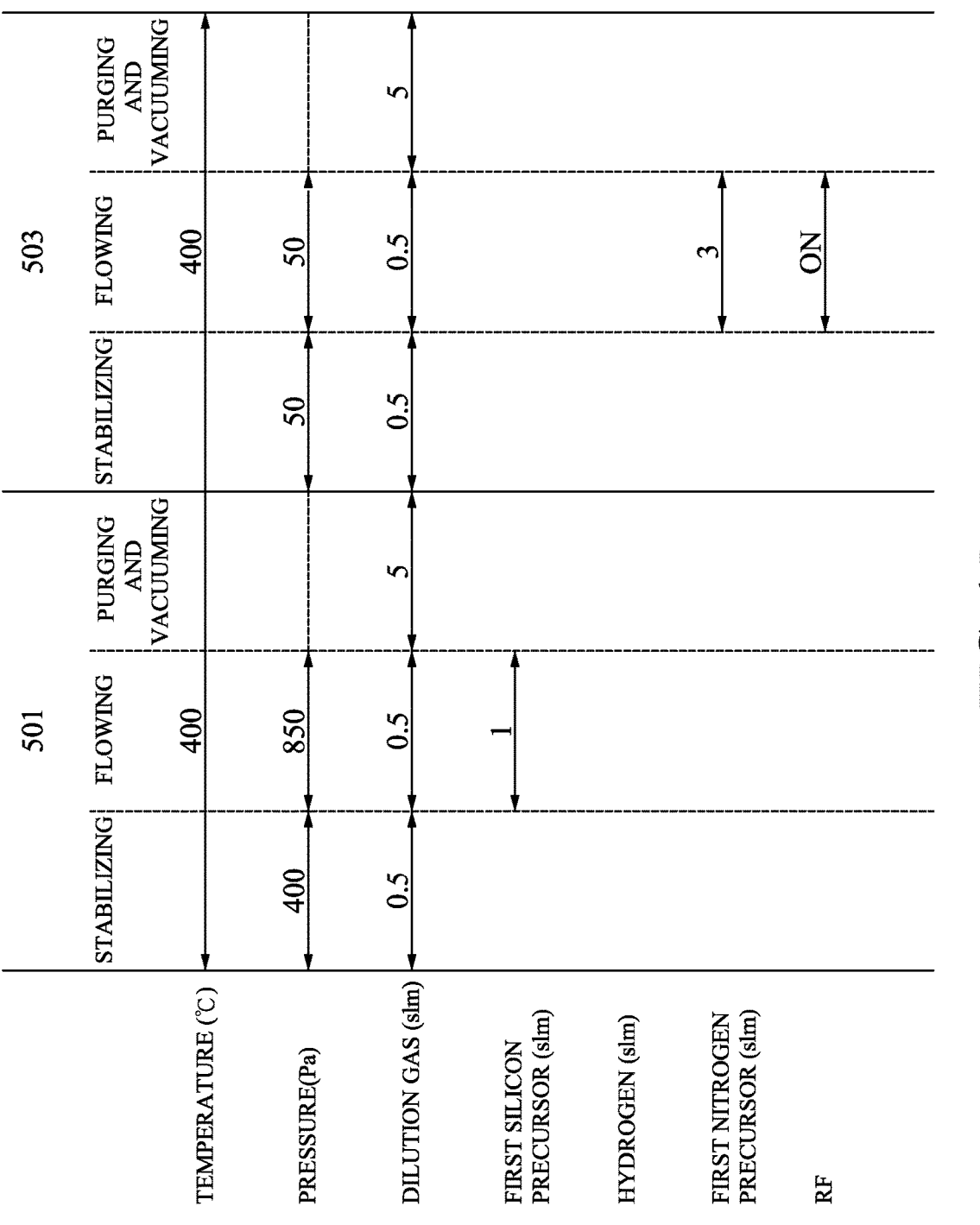
FIG. 15 is a chart showing an example of process conditions for forming an untreated layer in accordance with another embodiment of the present disclosure.
Figure 16:
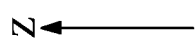
FIG. 16 illustrates, in a schematic cross-sectional view diagram, part of the flow for fabricating the semiconductor device in accordance with another embodiment of the present disclosure.
Figure 16:
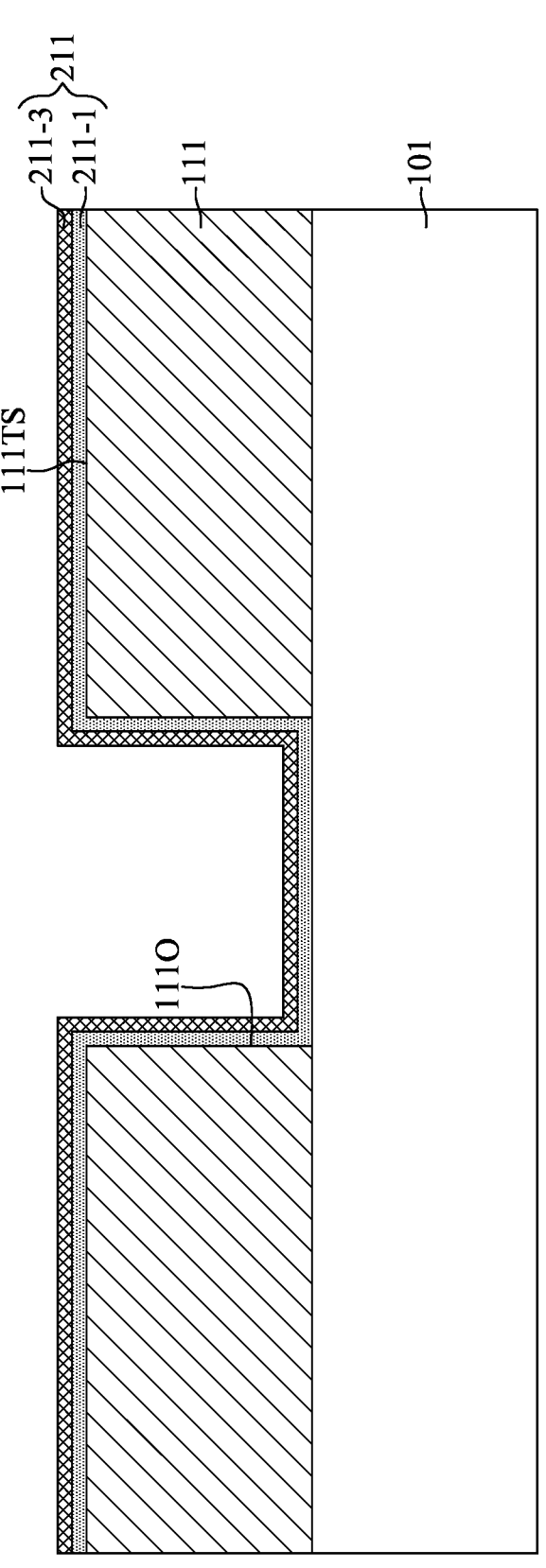
Figure 17:
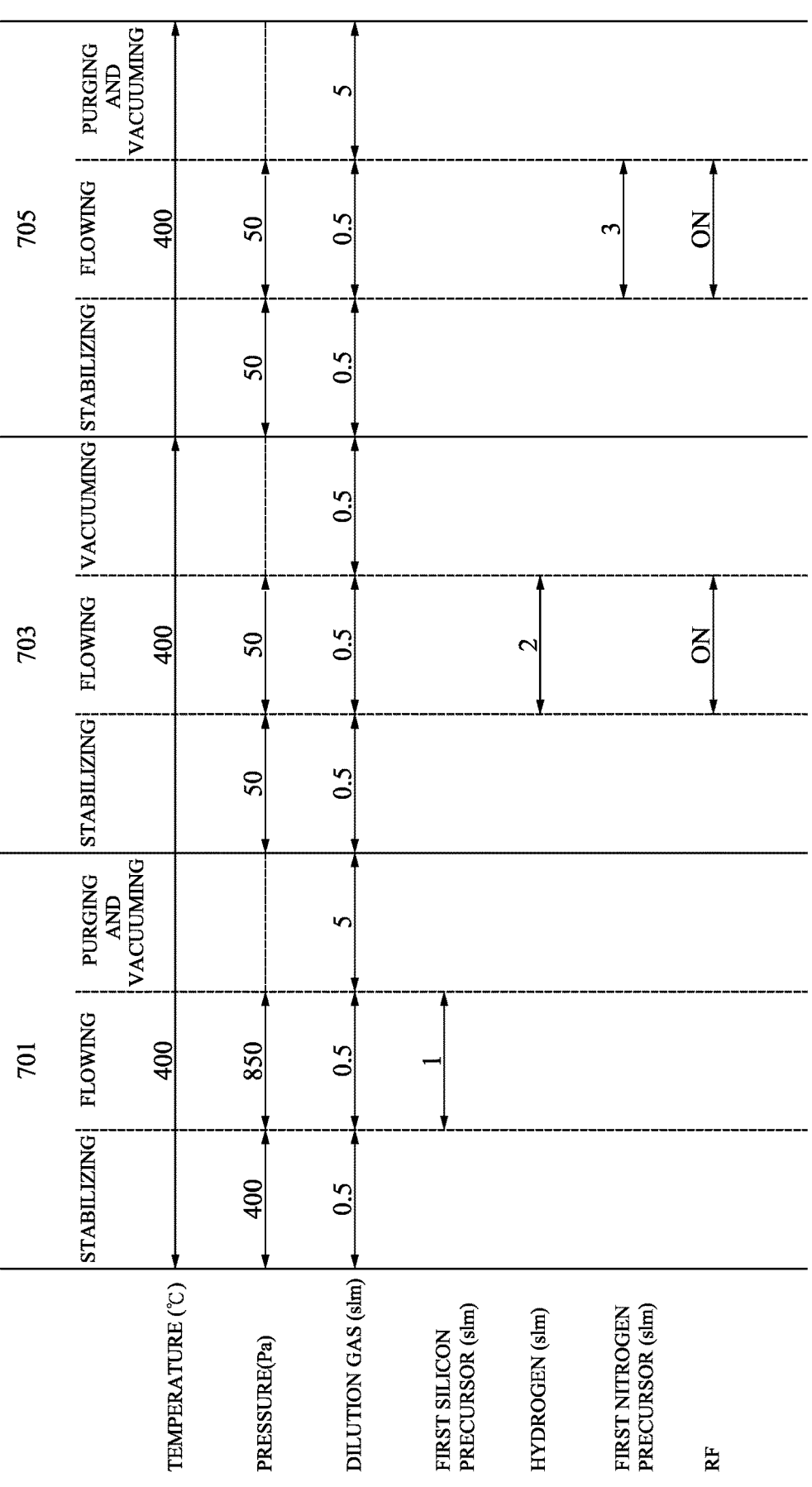
FIG. 17 is a chart showing an example of process conditions for forming a treated layer in accordance with another embodiment of the present disclosure.
Figure 18:
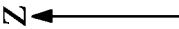
FIGS. 18 and 19 illustrate, in schematic cross-sectional view diagrams, part of the flow for fabricating the semiconductor device in accordance with another embodiment of the present disclosure.
Figure 19:
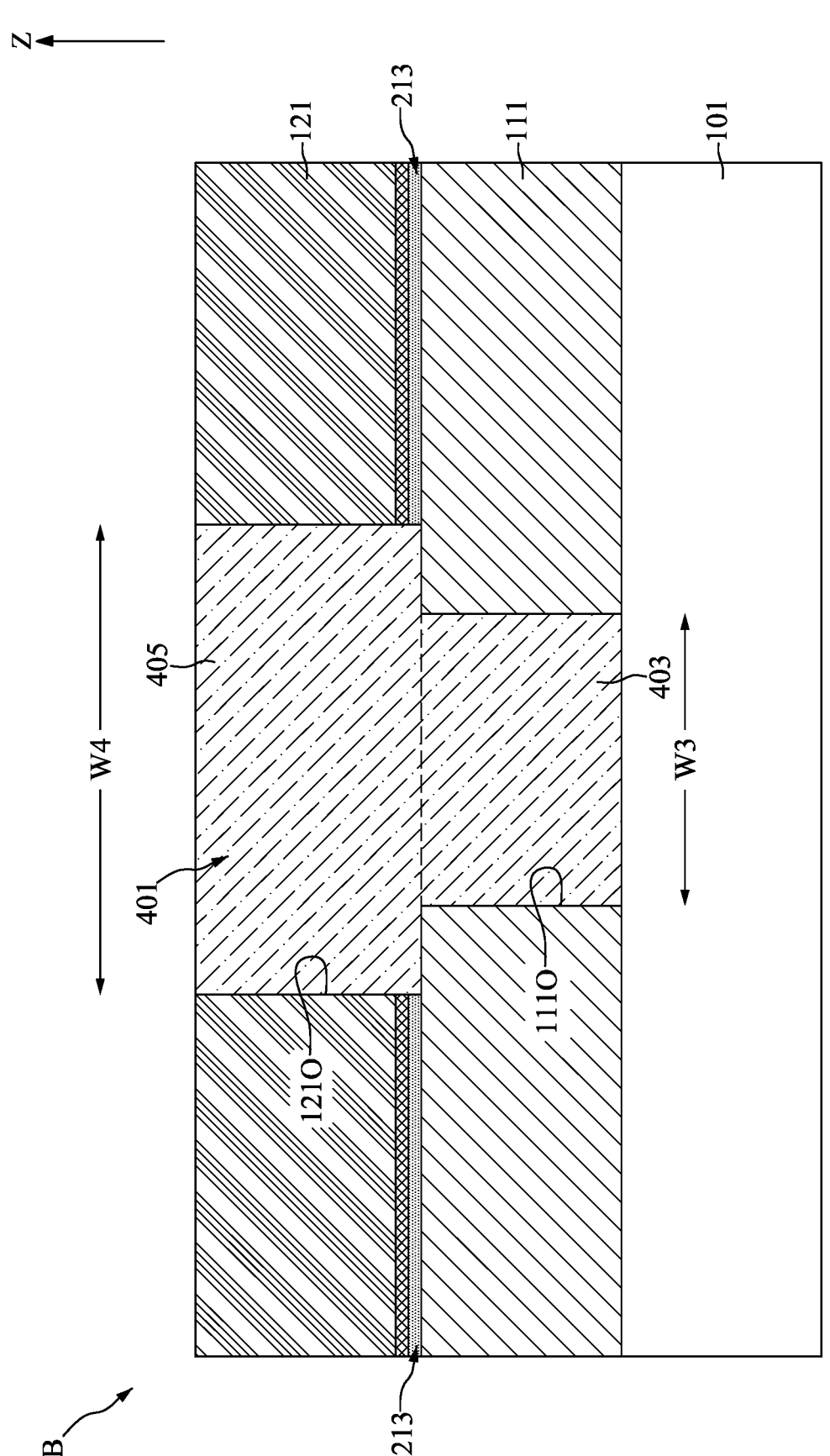

FIG. 14 illustrates, in a schematic cross-sectional view diagram, part of a flow for fabricating a semiconductor device 1B in accordance with another embodiment of the present disclosure. FIG. 15 is a chart showing an example of process conditions for forming an untreated layer 211-1 in accordance with another embodiment of the present disclosure. FIG. 16 illustrates, in a schematic cross-sectional view diagram, part of the flow for fabricating the semiconductor device 1B in accordance with another embodiment of the present disclosure. FIG. 17 is a chart showing an example of process conditions for forming a treated layer 211-3 in accordance with another embodiment of the present disclosure. FIGS. 18 and 19 illustrate, in schematic cross-sectional view diagrams, part of the flow for fabricating the semiconductor device 1B in accordance with another embodiment of the present disclosure.

With reference to FIG. 14, an intermediate semiconductor device may be fabricated with a procedure similar to that illustrated in FIGS. 2 and 3, and descriptions thereof are not repeated herein.

With reference to FIGS. 14 and 15, the untreated layer 211-1 including silicon nitride may be conformally formed in the first opening 111O and on the top surface 111TS of the first dielectric layer 111. The untreated layer 211-1 may be formed by a first deposition process. The first deposition may be an atomic layer deposition process. Generally, the atomic layer deposition process alternately supplies two (or more) different source gases one by one onto a process object under predetermined process conditions, so that chemical species from the source gases are adsorbed to the process object at a single atomic layer level, and are deposited on the process object through surface reactions. For instance, a first source gas and a second source gas are alternately supplied to a process object to flow along the surface thereof, thereby molecules (or chemical species) contained in the first source gas adsorb to the surface of the process object, and molecules (or chemical species) contained in the second source gas react with the adsorbed molecules originated from the first source gas to form a film of a thickness of a single molecule level. The above process steps are performed repeatedly, so that a high-quality film may be formed on the process object.

Detailedly, the first deposition process may include a first silicon precursor supplying step 501 and a first nitrogen precursor supplying step 503 performed sequentially. In the first silicon precursor supplying step 501, a first silicon precursor may be supplied to the reaction chamber and the chemical species from the first silicon precursor may be adsorbed to the top surface 111TS of the first dielectric layer 111 and the inner surface of the first opening 111O at a single atomic layer level. In the first nitrogen precursor supplying step 503, a first nitrogen precursor may be activated and supplied to the reaction chamber and the chemical species contained in the first nitrogen precursor may react with the adsorbed chemical species originated from the first silicon precursor to form an untreated layer 211-1 of a thickness of a single molecule level. The untreated layer 211-1 may be conformally formed on the top surface 111TS of the first dielectric layer 111 and in the first opening 111O.

Detailedly, the first silicon precursor supplying step 501 may include a stabilizing stage, a flowing stage, and a purging and vacuuming stage.

With reference to FIGS. 14 and 15, in the stabilizing stage of the first silicon precursor supplying step 501, a dilution gas (or a carrier gas) such as nitrogen gas may be supplied to the reaction chamber. A flow rate of the dilution gas may be between about 0.3 slm (standard liter per minute) and about 0.7 slm. For example, in the embodiment depicted, the flow rate of the dilution gas may be 0.5 slm. A process temperature of the stabilizing stage may be between about 25° C. and about 700° C., between about 50° C. and about 600° C., between about 100° C. and about 500° C., between about 200° C. and about 450° C., or between about 350° C. and about 425° C. For example, in the embodiment depicted, the process temperature of the stabilizing stage may be 400° C. A process pressure of the stabilizing stage may be between about 200 Pa and about 600 Pa, between about 300 Pa and about 500 Pa, or between about 350 Pa and about 450 Pa. For example, in the present embodiment, the process pressure of the stabilizing stage may be 400 Pa.

With reference to FIGS. 14 and 15, in the flowing stage of the first silicon precursor supplying step 501, the first silicon precursor may be supplied to the reaction chamber while the dilution gas is supplying. The chemical species from the first silicon precursor may be adsorbed to the top surface 111TS of the first dielectric layer 111 and the inner surface of the first opening 111O at a single atomic layer level. In some embodiments, the first silicon precursor may include a halide, such as iodine (I) or chlorine (Cl). In the embodiment depicted, the first silicon precursor may be, for example, dichlorosilane. The reaction between the first silicon precursor and the surface to be absorbed may be shown in Formula 1. In some embodiments, the first silicon precursor may include, for example, silicon tetrachloride, trichlorosilane, dichlorosilane, or hexachlorodisilane. In some embodiments, the first silicon precursor may include, for example, silicon tetraiodide, triiododsilane, diiodosilane, iodosilane, disilicon hexaiodide, trisilicon octaiodide, $H_2Si_2I_4$, $H_3Si_2I_3$, $H_4Si_2I_2$, $H_5Si_2I$, or $HSi_2I_5$. In some embodiments, the first silicon precursor may include one of triiododsilane, diiodosilane, iodosilane, $H_2Si_2I_4$, $H_4Si_2I_2$, and $H_5Si_2I$. In some embodiments, the first silicon precursor may include two, three, four, five or six of triiododsilane, diiodosilane, iodosilane, $H_2Si_2I_4$, $H_4Si_2I_2$, and $H_5Si_2I$, including any combinations thereof.

$$—NH_2+SiH_2Cl_2\rightarrow—NH—SiH_2Cl+HCl\uparrow \qquad \text{(Formula 1)}$$

With reference to FIGS. 14 and 15, in the flowing stage of the first silicon precursor supplying step 501, a flow rate of the first silicon precursor may be between about 1 slm and about 5 slm or between about 3 slm and about 4.5 slm. For example, in the embodiment depicted, the flow rate of the first silicon precursor may be 1 slm. If the flow rate of the first silicon precursor is lower than 1 slm, the amount of the first silicon precursor may be not sufficient to supply to nitrogen atoms on the top surface 111TS of the first dielectric layer 111 and the inner surface of the first opening 111O. If the flow rate of the first silicon precursor is greater than 5 slm, an amount of the first silicon precursor may not react with nitrogen atoms on the top surface of the substrate 101. A flow rate of the dilution gas may be between about 0.3 slm and about 0.7 slm. For example, in the embodiment depicted, the flow rate of the dilution gas may be 0.5 slm.

With reference to FIGS. 14 and 15, in the flowing stage of the first silicon precursor supplying step 501, a process temperature of the flowing stage may be between about 200° C. and about 550° C. For example, in the embodiment depicted, the process temperature of the flowing stage may be 400° C. If the process temperature is lower than 200° C., the chemical species from the first silicon precursor may not be adsorbed to the top surface 111TS of the first dielectric layer 111 and the inner surface of the first opening 111O. If the process temperature is greater than 550° C., the reliability of device elements in the substrate 101 may be affected. In some embodiments, the process temperature of the flowing stage may be between about 390° C. and about 410° C. By using the aforementioned temperature range, the deposition rate may be increased, and various characteristics, such as thickness uniformity, wet etch resistance property and film stress, of the resultant silicon nitride layer may be improved.

With reference to FIGS. 14 and 15, in the flowing stage of the first silicon precursor supplying step 501, a process pressure of the flowing stage may be between about 400 Pa and about 1200 Pa, between about 600 Pa and about 1100 Pa, or between about 800 Pa and about 1000 Pa. For example, the in the present embodiment, the process pressure of the flowing stage may be 850 Pa. By using the aforementioned pressure range, the reaction rate between nitrogen atoms and the first silicon precursor may be increased and the pressure may be readily regulated.

With reference to FIGS. 14 and 15, in the purging and vacuuming stage of the first silicon precursor supplying step 501, the supply of the first silicon precursor may be stopped. A flow rate of the dilution gas may be increased to purge the reaction chamber. For example, the flow rate of the dilution gas may be between about 3 slm and about 7 slm. In the embodiment depicted, the flow rate of the dilution gas may be 5 slm.

Detailedly, the first nitrogen precursor supplying step 503 may include a stabilizing stage, a flowing stage, and a purging and vacuuming stage.

With reference to FIGS. 14 and 15, in the stabilizing stage of the first nitrogen precursor supplying step 503, a dilution gas such as nitrogen gas may be supplied to the reaction chamber. A flow rate of the dilution gas may be between about 0.3 slm and about 0.7 slm. For example, in the embodiment depicted, the flow rate of the dilution gas may be 0.5 slm. A process temperature of the stabilizing stage may be between about 25° C. and about 700° C., between about 50° C. and about 600° ° C., between about 100° C. and about 500° C., between about 200° C. and about 450° C., or between about 350° C. and about 425° C. For example, in the embodiment depicted, the process temperature of the stabilizing stage may be 400° C. A process pressure of the stabilizing stage may be between about 10 Pa and about 70 Pa, between about 20 Pa and about 60 Pa, or between about 30 Pa and about 50 Pa. For example, in the present embodiment, the process pressure of the stabilizing stage may be 50 Pa.

With reference to FIGS. 14 and 15, in the flowing stage of the first nitrogen precursor supplying step 503, the first nitrogen precursor may be activated in a plasma generating unit and then supplied to the reaction chamber while the dilution gas is supplying. The chemical species contained in the activated first nitrogen precursor may react with the adsorbed chemical species that originated from the first silicon precursor to form the untreated layer 211-1 on the top surface 111TS of the first dielectric layer 111 and the inner surface of the first opening 111O. The first nitrogen precursor may be, for example, ammonia gas.

With reference to FIGS. 14 and 15, in the flowing stage of the first nitrogen precursor supplying step 503, a radio frequency (RF) in the plasma generating unit may be turned on to activate the first nitrogen precursor. A radio frequency power of the flowing stage may be between about 50 W and about 1000 W or between about 100 W and about 300 W. If the radio frequency power of the flowing stage is greater than 1000 W, the quarts walls of the plasma generating unit may be damaged. A radio frequency power density of the flowing stage may be between about 0.02 W/cm² and about 2.0 W/cm² or between about 0.05 W/cm² and about 1.5 W/cm². The process frequency of the plasma generating unit may be between about 10.00 MHz and about 15.00 MHz. For example, in the embodiment depicted, the process frequency of the plasma generating unit in the flowing stage may be 13.56 MHz. In the embodiment depicted, the activated first nitrogen precursors may be ammonia radicals (NH₃*). The activated first nitrogen precursor may be supplied to the reaction chamber in the form of plasma.

With reference to FIGS. 14 and 15, in the flowing stage of the first nitrogen precursor supplying step 503, a flow rate of the activated first nitrogen precursor may be between about 0.5 slm and about 5 slm or between 3 slm and about 5 slm. By using the aforementioned flow rate range, the plasma of activated first nitrogen precursor may be readily generated and the amount of the activated first nitrogen precursor may be sufficient to react with the adsorbed chemical species originated from the first silicon precursor. In the embodiment depicted, the flow rate of the activated first nitrogen precursor may be, for example, 3 slm. It should be noted that the dilution gas may be still supplied in the flowing stage and a flow rate of the dilution gas may be between about 0.3 slm and about 0.7 slm. For example, in the embodiment depicted, the flow rate of the dilution gas may be still 0.5 slm.

With reference to FIGS. 14 and 15, in the flowing stage of the first nitrogen precursor supplying step 503, a process pressure in the reaction chamber may be between about 40 Pa and about 100 Pa or between about 50 Pa and about 70 Pa. For example, in the embodiment depicted, the process pressure in the reaction chamber may be 50 Pa. A process pressure in the plasma generating unit may be between about 70 Pa and about 600 Pa or between about 280 Pa and about 330 Pa. By using the aforementioned process pressure range in the plasma generating unit, the plasma of activated first nitrogen precursor may be readily generated and the amount of the activated first nitrogen precursor may be sufficient to react with the adsorbed chemical species originated from the first silicon precursor.

With reference to FIGS. 14 and 15, in the flowing stage of the first nitrogen precursor supplying step 503, reactions between the activated first nitrogen precursor and the adsorbed chemical species originated from the first silicon precursor may be shown in Formula 2 and Formula 3. The untreated layer 211-1 consisting of —NH—SiH₂(NH₂) and —NH—SiHCl(NH₂) may be formed after the surface reactions. It should be noted that, the presence of the impurities such as chlorine in the untreated layer 211-1 may have adverse effects to some properties, such as film stress and wet etch resistance property, of the resultant layer.

$$\text{—NH—SiH}_2\text{Cl+NH}_3\text{*}\rightarrow\text{—NH—SiH}_2(\text{NH}_2)+\text{HCl}\Uparrow \quad \text{(Formula 2)}$$

$$\text{—NH—SiH}_2\text{Cl+NH}_3\text{*}\rightarrow\text{—NH—SiHCl(NH}_2)+\text{H}_2\Uparrow \quad \text{(Formula 3)}$$

With reference to FIGS. 14 and 15, in the purging and vacuuming stage of the first nitrogen precursor supplying step 503, the supply of the first nitrogen precursor may be stopped and the radio frequency of the plasma generating unit may be turned off. A flow rate of the dilution gas may be increased to purge the reaction chamber. For example, the flow rate of the dilution gas may be between about 3 slm and about 7 slm. In the embodiment depicted, the flow rate of the dilution gas may be 5 slm.

After the first deposition process, one layer of the untreated layer 211-1 may be formed. The first deposition process may be repeated for plural times to form layers of the untreated layer 211-1 of desired thickness. In some embodiments, the repeat times of the first deposition process may be between about 20 and about 60, between about 30 and about 50, or between about 34 and 40.

With reference to FIGS. 16 and 17, a treated layer 211-3 including silicon nitride may be formed on the untreated layer 211-1, and the untreated layer 211-1 and the treated layer 211-3 together form the first liner layer 211 formed of silicon nitride.

With reference to FIGS. 16 and 17, the treated layer 211-3 may be formed by a second deposition process. The second deposition may be an atomic layer deposition process. The second deposition process may include a second silicon precursor supplying step 701, a first hydrogen radical purging step 703, and a second nitrogen precursor supplying step 705 performed sequentially. In the second silicon precursor supplying step 701, a second silicon precursor may be supplied to the reaction chamber and the chemical species from the second silicon precursor may be adsorbed to the top surface of the untreated layer 211-1 at a single atomic layer level. In the first hydrogen radical purging step 703, hydrogen radicals may be supplied to the reaction chamber to substituted impurities, such as chlorine, contained in the adsorbed chemical species originated from the second silicon precursor. Accordingly, the amount of impurities contained in the adsorbed chemical species originated from the second silicon precursor may be reduced. In the second nitrogen precursor supplying step 705, a second nitrogen precursor may be activated and supplied to the reaction chamber and the chemical species contained in the second nitrogen precursor may react with the adsorbed chemical species originated from the second silicon precursor to form a treated layer 211-3 of a thickness of a single molecule level. The treated layer 211-3 may be conformally formed on the top surface of the untreated layer 211-1.

Detailedly, the second silicon precursor supplying step 701 may include a stabilizing stage, a flowing stage, and a purging and vacuuming stage.

With reference to FIGS. 16 and 17, in the stabilizing stage of the second silicon precursor supplying step 701, a dilution gas such as nitrogen gas may be supplied to the reaction chamber. A flow rate of the dilution gas may be between about 0.3 slm and about 0.7 slm. For example, in the embodiment depicted, the flow rate of the dilution gas may be 0.5 slm. A process temperature of the stabilizing stage may be between about 25° C. and about 700° C., between about 50° C. and about 600° C., between about 100° C. and about 500° C., between about 200° C. and about 450° C., or between about 350° C. and about 425° C. For example, in the embodiment depicted, the process temperature of the stabilizing stage may be 400° C. A process pressure of the stabilizing stage may be between about 200 Pa and about 600 Pa, between about 300 Pa and about 500 Pa, or between about 350 Pa and about 450 Pa. For example, in the present embodiment, the process pressure of the stabilizing stage may be 400 Pa.

With reference to FIGS. 16 and 17, in the flowing stage of the second silicon precursor supplying step 701, the second silicon precursor may be supplied to the reaction chamber while the dilution gas is supplying. The chemical species from the second silicon precursor may be adsorbed to the top surface of the untreated layer 211-1 at a single atomic layer level. In some embodiments, the second silicon precursor may include a halide, such as iodine (I) or chlorine (Cl). In the embodiment depicted, the second silicon precursor may be, for example, dichlorosilane. The reaction between the second silicon precursor and the untreated layer 211-1 may be similar to the reaction between the first silicon precursor and the top surface 111TS of the first dielectric layer 111, and descriptions thereof are not repeated herein. In some embodiments, the second silicon precursor may include, for example, silicon tetrachloride, trichlorosilane, dichlorosilane, or hexachlorodisilane. In some embodiments, the second silicon precursor may include, for example, silicon tetraiodide, triiododsilane, diiodosilane, iodosilane, disilicon hexaiodide, trisilicon octaiodide, $H_2Si_2I_4$, $H_3Si_2I_3$, $H_4Si_2I_2$, $H_5Si_2I$, or $HSi_2I_5$. In some embodiments, the second silicon precursor may include one of triiododsilane, diiododsilane, iodosilane, $H_2Si_2I_4$, $H_4Si_2I_2$, and $H_5Si_2I$. In some embodiments, the second silicon precursor may include two, three, four, five, or six of triiododsilane, diiodosilane, iodosilane, $H_2Si_2I_4$, $H_4Si_2I_2$, and $H_5Si_2I$, including any combinations thereof.

With reference to FIGS. 16 and 17, in the flowing stage of the second silicon precursor supplying step 701, a flow rate of the second silicon precursor may be between about 1 slm and about 5 slm or between about 3 slm and about 4.5 slm. For example, in the embodiment depicted, the flow rate of the second silicon precursor may be 1 slm. If the flow rate of the second silicon precursor is lower than 1 slm, the amount of the second silicon precursor may be not sufficient to supply to nitrogen atoms on the top surface of the untreated layer 211-1. If the flow rate of the second silicon precursor is greater than 5 slm, an amount of the second silicon precursor may not react with nitrogen atoms on the top surface of the untreated layer 211-1. A flow rate of the dilution gas may be between about 0.3 slm and about 0.7 slm. For example, in the embodiment depicted, the flow rate of the dilution gas may be 0.5 slm.

With reference to FIGS. 16 and 17, in the flowing stage of the second silicon precursor supplying step 701, a process temperature of the flowing stage may be between about 200°

C. and about 550° C. For example, in the embodiment depicted, the process temperature of the flowing stage may be 400° C. If the process temperature is lower than 200° C., the chemical species from the second silicon precursor may not be adsorbed to the top surface of the untreated layer 211-1. If the process temperature is greater than 550° C., the reliability of device elements in the substrate 101 may be affected. In some embodiments, the process temperature of the flowing stage may be between about 390° C. and about 410° C. By using the aforementioned temperature range, the deposition rate may be increased, and various characteristics, such as thickness uniformity, wet-etch resistance property and film stress, of the resultant silicon nitride layer may be improved.

With reference to FIGS. 16 and 17, in the flowing stage of the second silicon precursor supplying step 701, a process pressure of the flowing stage may be between about 400 Pa and about 1200 Pa, between about 600 Pa and about 1100 Pa, or between about 800 Pa and about 1000 Pa. For example, the in the present embodiment, the process pressure of the flowing stage may be 850 Pa. By using aforementioned pressure range, the reaction rate between nitrogen atoms and the first silicon precursor may be increased and the pressure may be readily regulated.

With reference to FIGS. 16 and 17, in the purging and vacuuming stage of the second silicon precursor supplying step 701, the supply of the second silicon precursor may be stopped. A flow rate of the dilution gas may be increased to purge the reaction chamber. For example, the flow rate of the dilution gas may be between about 3 slm and about 7 slm. In the embodiment depicted, the flow rate of the dilution gas may be 5 slm.

Detailedly, the first hydrogen radical purging step 703 may include a stabilizing stage, a flowing stage, and a vacuuming stage.

With reference to FIGS. 16 and 17, in the stabilizing stage of the first hydrogen radical purging step 703, a dilution gas such as nitrogen gas may be supplied to the reaction chamber. A flow rate of the dilution gas may be between about 0.3 slm and about 0.7 slm. For example, in the embodiment depicted, the flow rate of the dilution gas may be 0.5 slm. A process temperature of the stabilizing stage may be between about 25° C. and about 700° C., between about 50° C. and about 600° C., between about 100° ° C. and about 500° C., between about 200° C. and about 450° C., or between about 350° C. and about 425° C. For example, in the embodiment depicted, the process temperature of the stabilizing stage may be 400° C. A process pressure of the stabilizing stage may be between about 10 Pa and about 70 Pa, between about 20 Pa and about 60 Pa, or between about 30 Pa and about 50 Pa. For example, in the present embodiment, the process pressure of the stabilizing stage may be 50 Pa.

With reference to FIGS. 16 and 17, in the flowing stage of the first hydrogen radical purging step 703, a first radical source may be activated in the plasma generating unit and then supplied to the reaction chamber while the dilution gas is supplying. The activated first radical source may be supplied to the reaction chamber to substituted impurities, such as chlorine, contained in the adsorbed chemical species originated from the second silicon precursor. Accordingly, the amount of impurities contained in the adsorbed chemical species originated from the second silicon precursor may be reduced. The first radical source may be, for example, hydrogen gas.

With reference to FIGS. 16 and 17, in the flowing stage of the first hydrogen radical purging step 703, a radio frequency in the plasma generating unit may be turned on to activate the first radical source. A radio frequency power of the flowing stage may be between about 50 W and about 1000 W or between about 100 W and about 300 W. If the radio frequency power of the flowing stage is greater than 1000 W, the quarts walls of the plasma generating unit may be damaged. A radio frequency power density of the flowing stage may be between about 0.02 W/cm$^2$ and about 2.0 W/cm$^2$ or between about 0.05 W/cm$^2$ and about 1.5 W/cm$^2$. The process frequency of the plasma generating unit may be between about 10.00 MHz and about 15.00 MHz. For example, in the embodiment depicted, the process frequency of the plasma generating unit in the flowing stage may be 13.56 MHZ. In the embodiment depicted, the activated first radical source may be hydrogen radicals (H$_2$*, H*). The activated first radical source may be supplied to the reaction chamber in the form of plasma.

With reference to FIGS. 16 and 17, in the flowing stage of the first hydrogen radical purging step 703, a flow rate of the activated first radical source may be between about 0.5 slm and about 5 slm or between 1.5 slm and about 2.3 slm. By using the aforementioned flow rate range, the plasma of activated first radical source may be readily generated and the amount of the activated first radical source may be sufficient to substitute impurities contained in the adsorbed chemical species originated from the second silicon precursor. In the embodiment depicted, the flow rate of the activated first nitrogen precursor may be, for example, 2 slm. It should be noted that the dilution gas may be still supplied in the flowing stage and a flow rate of the dilution gas may be between about 0.3 slm and about 0.7 slm. For example, in the embodiment depicted, the flow rate of the dilution gas may be still 0.5 slm.

With reference to FIGS. 16 and 17, in the flowing stage of the first hydrogen radical purging step 703, a process pressure in the plasma generating unit may be between about 70 Pa and about 400 Pa or between about 350 Pa and about 400 Pa. By using the aforementioned process pressure range in the plasma generating unit, the plasma of activated first radical source may be readily generated and the amount of the activated first radical source may be sufficient to substitute impurities contained in the adsorbed chemical species originated from the second silicon precursor. A process pressure in the reaction chamber may be between about 40 Pa and about 100 Pa or between about 50 Pa and about 70 Pa. For example, in the embodiment depicted, the process pressure in the reaction chamber may be 50 Pa.

With reference to FIGS. 16 and 17, in the flowing stage of the first hydrogen radical purging step 703, the substitution reaction between the activated first radical source and the impurities contained in the adsorbed chemical species originated from the second silicon precursor may be shown in Formula 4. In the embodiment depicted, the hydrogen radicals (expressed by "H$_2$" in Formula 4) may substitute the chlorine contained in the chemical species, and the chlorine may be combined with hydrogen radicals to form hydrogen chloride and may be removed. As a result, chlorine concentration in the resultant silicon nitride layer may be lowered, by removing chlorine in the first hydrogen radical purging step 703. Accordingly, the wet etch rate of the resultant silicon nitride layer may be lowered. In other words, the etch resistance property of the resultant silicon nitride layer may be improved.

$$—NH_2+SiH_2Cl+H_2 \rightarrow —NH—SiH_3+HCl\Uparrow \qquad \text{(Formula 4)}$$

With reference to FIGS. 16 and 17, in the vacuuming stage of the first hydrogen radical purging step 703, the supply of the first radical source may be stopped and the radio frequency of the plasma generating unit may be turned off. The dilution gas may be still supplied to the reaction chamber. A flow rate of the dilution gas may be between about 0.3 slm and about 0.7 slm. In the embodiment depicted, the flow rate of the dilution gas may be 0.5 slm.

Detailedly, the second nitrogen precursor supplying step 705 may include a stabilizing stage, a flowing stage, and a purging and vacuuming stage.

With reference to FIGS. 16 and 17, in the stabilizing stage of the second nitrogen precursor supplying step 705, a dilution gas such as nitrogen gas may be supplied to the reaction chamber. A flow rate of the dilution gas may be between about 0.3 slm and about 0.7 slm. For example, in the embodiment depicted, the flow rate of the dilution gas may be 0.5 slm. A process temperature of the stabilizing stage may be between about 25° C. and about 700° C., between about 50° C. and about 600° C., between about 100° C. and about 500° C., between about 200° C. and about 450° C., or between about 350° C. and about 425° C. For example, in the embodiment depicted, the process temperature of the stabilizing stage may be 400° C. A process pressure of the stabilizing stage may be between about 10 Pa and about 70 Pa, between about 20 Pa and about 60 Pa, or between about 30 Pa and about 50 Pa. For example, the in the present embodiment, the process pressure of the stabilizing stage may be 50 Pa.

In some embodiments, two stages of the second deposition process may overlap or be combined. For example, the vacuuming stage of the first hydrogen radical purging step 703 and the stabilizing stage of the second nitrogen precursor supplying step 705 may be partially or completely overlapped.

With reference to FIGS. 16 and 17, in the flowing stage of the second nitrogen precursor supplying step 705, the second nitrogen precursor may be activated in the plasma generating unit and then supplied to the reaction chamber while the dilution gas is supplying. The chemical species contained in the activated second nitrogen precursor may react with the adsorbed chemical species originated from the second silicon precursor to form the treated layer 211-3 on the top surface of the untreated layer 211-1. The second nitrogen precursor may be, for example, ammonia gas.

With reference to FIGS. 16 and 17, in the flowing stage of the second nitrogen precursor supplying step 705, a radio frequency in the plasma generating unit may be turned on to activate the second nitrogen precursor. A radio frequency power of the flowing stage may be between about 50 W and about 1000 W or between about 100 W and about 300 W. If the radio frequency power of the flowing stage is greater than 1000 W, the quarts walls of the plasma generating unit may be damaged. A radio frequency power density of the flowing stage may be between about 0.02 W/cm$^2$ and about 2.0 W/cm$^2$ or between about 0.05 W/cm$^2$ and about 1.5 W/cm$^2$. The process frequency of the plasma generating unit may be between about 10.00 MHz and about 15.00 MHz. For example, in the embodiment depicted, the process frequency of the plasma generating unit in the flowing stage may be 13.56 MHz. In the embodiment depicted, the activated second nitrogen precursors may be ammonia radicals (NH$_3$*). The activated second nitrogen precursor may be supplied to the reaction chamber in the form of plasma.

With reference to FIGS. 16 and 17, in the flowing stage of the second nitrogen precursor supplying step 705, a flow rate of the activated second nitrogen precursor may be between about 0.5 slm and about 5 slm or between 3 slm and about 5 slm. By using the aforementioned flow rate range, the plasma of activated second nitrogen precursor may be readily generated and the amount of the activated second nitrogen precursor may be sufficient to react with the adsorbed chemical species originated from the second silicon precursor. In the embodiment depicted, the flow rate of the activated second nitrogen precursor may be, for example, 3 slm. It should be noted that the dilution gas may be still supplied in the flowing stage and a flow rate of the dilution gas may be between about 0.3 slm and about 0.7 slm. For example, in the embodiment depicted, the flow rate of the dilution gas may be still 0.5 slm.

With reference to FIGS. 16 and 17, in the flowing stage of the second nitrogen precursor supplying step 705, a process pressure in the reaction chamber may be between about 40 Pa and about 100 Pa or between about 50 Pa and about 70 Pa. For example, in the embodiment depicted, the process pressure in the reaction chamber may be 50 Pa. A process pressure in the plasma generating unit may be between about 70 Pa and about 600 Pa or between about 280 Pa and about 330 Pa. By using the aforementioned process pressure range in the plasma generating unit, the plasma of activated second nitrogen precursor may be readily generated and the amount of the activated second nitrogen precursor may be sufficient to react with the adsorbed chemical species originated from the second silicon precursor.

With reference to FIGS. 16 and 17, in the flowing stage of the second nitrogen precursor supplying step 705, the surface reaction between the activated second nitrogen precursor and the adsorbed chemical species originated from the second silicon precursor may be shown in Formula 5. The treated layer 211-3 consisting of —NH—SiH$_2$(NH$_2$) may be formed after the surface reaction.

$$\text{—NH—SiH}_3\text{+NH}_3\text{*→—NH—SiH}_2\text{(NH}_2\text{)+H}_2\Uparrow \qquad \text{(Formula 5)}$$

With reference to FIGS. 16 and 17, in the purging and vacuuming stage of the second nitrogen precursor supplying step 705, the supply of the second nitrogen precursor may be stopped and the radio frequency of the plasma generating unit may be turned off. A flow rate of the dilution gas may be increased to purge the reaction chamber. For example, the flow rate of the dilution gas may be between about 3 slm and about 7 slm. In the embodiment depicted, the flow rate of the dilution gas may be 5 slm.

After the second deposition process, one layer of the treated layer 211-3 may be formed. The second deposition process may be repeated for plural times to form layers of the treated layer 211-3 of desired thickness. In some embodiments, the repeat times of the second deposition process may be between about 5 and about 35, between about 10 and about 30, or between about 13 and 20. The untreated layer 211-1 and the treated layer 211-3 together form the first liner layer 211 on the top surface 111TS of the first dielectric layer 111 and in the inner surface of the first opening 111O.

In some embodiments, the silicon to nitrogen ratio of the first liner layer 211, which excluding hydrogen or other impurities, can be represented as SiN$_x$. The x may be between about 0.5 and about 2.0, between about 0.9 and 1.7, between about 1.0 and about 1.5, or between about 1.2 and 1.4.

Due to that the first hydrogen radical purging step 703 may remove impurities contained in the adsorbed chemical species originated from the second silicon precursor, the impurity concentration (i.e., chlorine concentration) of the treated layer 211-3 may be lower than the impurity concentration of the untreated layer 211-1. As a result, the resulting first liner layer 211 may have a high film stress and greater wet etch resistance property.

In addition, the composition of the first liner layer 211 may be readily controlled by changing the number of repetition of the first deposition process and the second deposition process, and thus the stress of the first liner layer 211 may be also readily controlled.

In some embodiments, the dilution gas may be, for example, nitrogen gas, argon gas, or helium gas. The first silicon precursor, the first nitrogen precursor, the second silicon precursor, the second nitrogen precursor, or the first radical source may be supplied with the aid of the dilution gas. The dilution gas may also serve as purge gas to purge excess precursors and byproducts.

In some embodiments, the first liner layer 211 may be formed of, silicon nitride, silicon oxynitride, silicon oxide nitride, or a combination thereof.

With reference to FIG. 18, the energy-removable layer 301, the second dielectric layer 121, and the second opening 121O may be formed with a procedure similar to that illustrated in FIGS. 7 to 10, and descriptions thereof are not repeated herein. The energy-removable layer 301 may be removed with a procedure similar to that illustrated in FIG. 11, and descriptions thereof are not repeated herein.

With reference to FIG. 18, after the energy-removable layer 301 is removed, a liner removal process may be performed to remove the first liner layer 211 exposed through the second opening 121O. In some embodiments, the removal rate ratio of the first liner layer 211 to the second dielectric layer 121 may be between about 100:1 and about 1.05:1, between about 15:1 and about 2:1, or between about 10:1 and about 2:1 during the liner removal process. In some embodiments, the removal rate ratio of the first liner layer 211 to the first dielectric layer 111 may be between about 100:1 and about 1.05:1, between about 15:1 and about 2:1, or between about 10:1 and about 2:1 during the liner removal process. In some embodiments, the removal rate ratio of the first liner layer 211 to the substrate 101 may be between about 100:1 and about 1.05:1, between about 15:1 and about 2:1, or between about 10:1 and about 2:1 during the liner removal process. After the liner removal process, the remaining first liner layer 211 may be turned into an intervening layer 213 between the second dielectric layer 121 and the first dielectric layer 111. The intervening layer 213 may be formed of, for example, silicon nitride, silicon oxynitride, silicon oxide nitride, or a combination thereof.

With reference to FIG. 19, the conductive structure 401 may be formed with a procedure similar to that illustrated in FIGS. 12 and 13, and descriptions thereof are not repeated herein.

One aspect of the present disclosure provides a semiconductor device including a substrate; a first dielectric layer positioned on the substrate; a first opening positioned along the first dielectric layer to expose the substrate; a first liner layer conformally positioned in the first opening and on a top surface of the first dielectric layer; an energy-removable layer positioned in the first opening; a second dielectric layer positioned on the first liner layer; and a second opening positioned along the second dielectric layer to expose the energy-removable layer. The second dielectric layer has etching selectivity to the first liner layer.

Another aspect of the present disclosure provides a semiconductor device including a substrate; a first dielectric layer positioned on the substrate; a second dielectric layer positioned on the first dielectric layer; a bottom portion positioned along the first dielectric layer and on the substrate; a top portion positioned along the second dielectric layer and on the bottom portion; and a first liner layer positioned between the bottom portion and the first dielectric layer, between the bottom portion and the substrate, and between the second dielectric layer and the first dielectric layer. The bottom portion and the top portion configure a conductive structure. The second dielectric layer has etching selectivity to the first liner layer. The first liner layer includes titanium nitride, tantalum nitride, or a combination thereof.

Another aspect of the present disclosure provides a semiconductor device including a substrate; a first dielectric layer positioned on the substrate; a second dielectric layer positioned on the first dielectric layer; a bottom portion positioned along the first dielectric layer and on the substrate; a top portion positioned along the second dielectric layer and on the bottom portion; and an intervening layer positioned between the first dielectric layer and the second dielectric layer. The bottom portion and the top portion configure a conductive structure. The second dielectric layer has etching selectivity to the first liner layer. The intervening layer includes silicon nitride, silicon oxynitride, silicon nitride oxide, or a combination thereof.

Another aspect of the present disclosure provides a method for fabricating a semiconductor device including providing a substrate; forming a first dielectric layer on the substrate; forming a first opening along the first dielectric layer to expose the substrate; conformally forming a first liner layer in the first opening and on a top surface of the first dielectric layer; forming an energy-removable layer on the first liner layer and in the first opening; forming a second dielectric layer on the first liner layer and on the energy-removable layer; forming a second opening along the second dielectric layer to expose the energy-removable layer; removing the energy-removable layer; and forming a conductive structure to fill the first opening and the second opening. The second dielectric layer has etching selectivity to the first liner layer.

Due to the design of the semiconductor device of the present disclosure, the first liner layer 211 may serve as an etching stop layer due to the selectivity between the second dielectric layer 121 and the first liner layer 211. Hence, the complexity of fabricating the semiconductor device 1A may be reduced. In addition, the profile of the first opening 111O may be intact during the formation of the second opening 121O due to the presence of the energy-removable layer 301. As a result, the performance of the resultant conductive structure 401 may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate;
a first dielectric layer positioned on the substrate, wherein the first dielectric layer has a first opening;
a second dielectric layer positioned on the first dielectric layer, wherein the second dielectric layer has a second opening;
a conductive structure comprising:
a bottom portion positioned along the first dielectric layer within the first opening thereof and on the substrate; and
a top portion positioned along the second dielectric layer within the second opening thereof and on the bottom portion; and
a first liner layer positioned between the bottom portion and the first dielectric layer, between the bottom portion and the substrate, and between the second dielectric layer and the first dielectric layer;
wherein the second dielectric layer has etching selectivity to the first liner layer;
wherein the first liner layer comprises titanium nitride, tantalum nitride, or a combination thereof.

2. The semiconductor device of claim 1, wherein a width of the bottom portion of the conductive structure is less than a width of the top portion thereof, wherein a top surface of the top portion of the conductive structure is coplanar with a top surface of the second dielectric layer.

3. The semiconductor device of claim 2, wherein the first dielectric layer and the second dielectric layer comprise a same material.

4. The semiconductor device of claim 2, wherein the first dielectric layer and the second dielectric layer comprise different materials.

5. The semiconductor device of claim 4, wherein the first dielectric layer comprises silicon oxide.

6. A semiconductor device, comprising:
a substrate;
a first dielectric layer positioned on the substrate;
a second dielectric layer positioned on the first dielectric layer;
a conductive structure comprising:
a bottom portion positioned along the first dielectric layer and on the substrate; and
a top portion positioned along the second dielectric layer and on the bottom portion; and
an intervening layer positioned between the first dielectric layer and the second dielectric layer, wherein the intervening layer is positioned above the bottom portion of the conductive structure;
wherein the second dielectric layer has etching selectivity to the intervening layer;
wherein the intervening layer comprises silicon nitride, silicon oxynitride, silicon nitride oxide, or a combination thereof.

7. The semiconductor device of claim 6, wherein a width of the bottom portion of the conductive structure is less than a width of the top portion thereof.

8. The semiconductor device of claim 7, wherein the first dielectric layer and the second dielectric layer comprise a same material.

9. The semiconductor device of claim 7, wherein the first dielectric layer and the second dielectric layer comprise different materials.

10. The semiconductor device of claim 9, wherein the first dielectric layer comprises silicon oxide.

* * * * *